US008650352B2

(12) United States Patent
Weingarten

(10) Patent No.: US 8,650,352 B2
(45) Date of Patent: Feb. 11, 2014

(54) SYSTEMS AND METHODS FOR DETERMINING LOGICAL VALUES OF COUPLED FLASH MEMORY CELLS

(75) Inventor: Hanan Weingarten, Herzelia (IL)

(73) Assignee: Densbits Technologies Ltd., Haifa (IL)

( * ) Notice: Subject to any disclaimer, the term of this patent is extended or adjusted under 35 U.S.C. 154(b) by 400 days.

(21) Appl. No.: 12/666,520

(22) PCT Filed: Sep. 17, 2008

(86) PCT No.: PCT/IL2008/001234
§ 371 (c)(1),
(2), (4) Date: Dec. 23, 2009

(87) PCT Pub. No.: WO2009/037697
PCT Pub. Date: Mar. 26, 2009

(65) Prior Publication Data
US 2010/0211724 A1    Aug. 19, 2010

Related U.S. Application Data

(60) Provisional application No. 60/960,207, filed on Sep. 20, 2007, provisional application No. 61/071,467, filed on Apr. 30, 2008.

(51) Int. Cl.
*G06F 12/02*    (2006.01)

(52) U.S. Cl.
USPC ............... 711/103; 711/E12.008; 365/185.18

(58) Field of Classification Search
USPC ........ 711/103, E12.008; 365/189.01, 185.03, 365/185.18
See application file for complete search history.

(56) References Cited

U.S. PATENT DOCUMENTS

| | | | |
|---|---|---|---|
| 4,463,375 A | 7/1984 | Macovski |
| 4,584,686 A | 4/1986 | Fritze |
| 4,589,084 A | 5/1986 | Fling et al. |
| 4,866,716 A | 9/1989 | Weng |
| 5,077,737 A | 12/1991 | Leger et al. |
| 5,297,153 A | 3/1994 | Baggen et al. |
| 5,657,332 A | 8/1997 | Auclair et al. |
| 5,729,490 A | 3/1998 | Calligaro et al. |
| 5,793,774 A | 8/1998 | Usui et al. |
| 5,926,409 A | 7/1999 | Engh et al. |
| 5,956,268 A | 9/1999 | Lee |
| 5,982,659 A | 11/1999 | Irrinki et al. |
| 6,038,634 A | 3/2000 | Ji et al. |

(Continued)

FOREIGN PATENT DOCUMENTS

| | | | |
|---|---|---|---|
| JP | 411339489 | * | 12/1999 |
| WO | WO 04001802 | * | 12/2003 |

OTHER PUBLICATIONS

International Search Report for International Application No. PCT/IL08/01234 mailed Mar. 24, 2009.
Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.

(Continued)

*Primary Examiner* — Pierre-Michel Bataille
(74) *Attorney, Agent, or Firm* — Dentons US LLP

(57) ABSTRACT

Systems and methods for determining program levels useful for reading cells of a flash memory, such as but not limited to detecting charge levels for the cells, obtaining joint conditional probability densities for a plurality of combinations of program levels of the cells; and determining program levels for the cells respectively such that an aggregated joint probability value of the joint conditional probability densities is maximized.

41 Claims, 18 Drawing Sheets

(56) References Cited

U.S. PATENT DOCUMENTS

| | | | |
|---|---|---|---|
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 * | 2/2001 | Hirano | 365/185.18 |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |
| 6,301,151 B1 | 10/2001 | Engh et al. | |
| 6,370,061 B1 | 4/2002 | Yachareni et al. | |
| 6,374,383 B1 | 4/2002 | Weng | |
| 6,504,891 B1 | 1/2003 | Chevallier | |
| 6,532,169 B1 | 3/2003 | Mann et al. | |
| 6,532,556 B1 | 3/2003 | Wong et al. | |
| 6,553,533 B2 | 4/2003 | Demura et al. | |
| 6,560,747 B1 | 5/2003 | Weng | |
| 6,637,002 B1 | 10/2003 | Weng et al. | |
| 6,639,865 B2 | 10/2003 | Kwon | |
| 6,674,665 B1 | 1/2004 | Mann et al. | |
| 6,704,902 B1 | 3/2004 | Shinbashi et al. | |
| 6,751,766 B2 | 6/2004 | Guterman et al. | |
| 6,772,274 B1 | 8/2004 | Estakhri | |
| 6,781,910 B2 | 8/2004 | Smith | |
| 6,792,569 B2 | 9/2004 | Cox et al. | |
| 6,873,543 B2 | 3/2005 | Smith et al. | |
| 6,891,768 B2 | 5/2005 | Smith et al. | |
| 6,914,809 B2 | 7/2005 | Hilton et al. | |
| 6,915,477 B2 | 7/2005 | Gollamudi et al. | |
| 6,952,365 B2 | 10/2005 | Gonzalez et al. | |
| 6,961,890 B2 | 11/2005 | Smith | |
| 6,990,012 B2 | 1/2006 | Smith et al. | |
| 6,996,004 B1 | 2/2006 | Fastow et al. | |
| 6,999,854 B2 | 2/2006 | Roth | |
| 7,010,739 B1 | 3/2006 | Feng et al. | |
| 7,012,835 B2 | 3/2006 | Gonzalez et al. | |
| 7,038,950 B1 | 5/2006 | Hamilton et al. | |
| 7,068,539 B2 | 6/2006 | Guterman et al. | |
| 7,079,436 B2 | 7/2006 | Perner et al. | |
| 7,149,950 B2 | 12/2006 | Spencer et al. | |
| 7,177,977 B2 | 2/2007 | Chen et al. | |
| 7,191,379 B2 | 3/2007 | Adelmann et al. | |
| 7,196,946 B2 | 3/2007 | Chen et al. | |
| 7,203,874 B2 | 4/2007 | Roohparvar | |
| 7,290,203 B2 | 10/2007 | Emma et al. | |
| 7,292,365 B2 | 11/2007 | Knox | |
| 7,301,928 B2 | 11/2007 | Nakabayashi et al. | |
| 7,397,705 B1 * | 7/2008 | Huang et al. | 365/185.28 |
| 7,441,067 B2 | 10/2008 | Gorobets et al. | |
| 7,443,729 B2 * | 10/2008 | Li et al. | 365/185.17 |
| 7,466,575 B2 | 12/2008 | Shalvi et al. | |
| 7,533,328 B2 | 5/2009 | Alrod et al. | |
| 7,558,109 B2 | 7/2009 | Brandman et al. | |
| 7,593,263 B2 | 9/2009 | Sokolov et al. | |
| 7,697,326 B2 | 4/2010 | Sommer et al. | |
| 7,706,182 B2 | 4/2010 | Shalvi et al. | |
| 7,804,718 B2 | 9/2010 | Kim | |
| 7,805,663 B2 | 9/2010 | Brandman et al. | |
| 7,805,664 B1 | 9/2010 | Yang et al. | |
| 7,844,877 B2 | 11/2010 | Litsyn et al. | |
| 7,961,797 B1 | 6/2011 | Yang et al. | |
| 8,020,073 B2 | 9/2011 | Emma et al. | |
| 8,122,328 B2 | 2/2012 | Liu et al. | |
| 2002/0063774 A1 | 5/2002 | Hillis et al. | |
| 2002/0085419 A1 | 7/2002 | Kwon et al. | |
| 2002/0154769 A1 | 10/2002 | Petersen et al. | |
| 2003/0065876 A1 | 4/2003 | Lasser | |
| 2003/0101404 A1 | 5/2003 | Zhao et al. | |
| 2003/0105620 A1 | 6/2003 | Bowen | |
| 2003/0192007 A1 | 10/2003 | Miller et al. | |
| 2004/0015771 A1 | 1/2004 | Lasser et al. | |
| 2004/0030971 A1 | 2/2004 | Tanaka et al. | |
| 2004/0153722 A1 | 8/2004 | Lee | |
| 2004/0153817 A1 | 8/2004 | Norman et al. | |
| 2004/0181735 A1 | 9/2004 | Xin | |
| 2005/0013165 A1 | 1/2005 | Ban | |
| 2005/0018482 A1 * | 1/2005 | Cemea et al. | 365/185.03 |
| 2005/0083735 A1 | 4/2005 | Chen et al. | |
| 2005/0117401 A1 * | 6/2005 | Chen et al. | 365/189.01 |
| 2005/0120265 A1 | 6/2005 | Pline et al. | |
| 2005/0128811 A1 | 6/2005 | Kato et al. | |
| 2005/0138533 A1 | 6/2005 | Le-Bars et al. | |
| 2005/0144213 A1 | 6/2005 | Simkins et al. | |
| 2005/0144368 A1 | 6/2005 | Chung et al. | |
| 2005/0146931 A1 * | 7/2005 | Cernea et al. | 365/185.03 |
| 2005/0169057 A1 | 8/2005 | Shibata et al. | |
| 2005/0172179 A1 | 8/2005 | Brandenberger et al. | |
| 2005/0213393 A1 | 9/2005 | Lasser | |
| 2006/0059406 A1 | 3/2006 | Micheloni et al. | |
| 2006/0059409 A1 | 3/2006 | Lee | |
| 2006/0064537 A1 | 3/2006 | Oshima et al. | |
| 2006/0101193 A1 | 5/2006 | Murin | |
| 2006/0203587 A1 | 9/2006 | Li et al. | |
| 2006/0221692 A1 | 10/2006 | Chen | |
| 2006/0248434 A1 | 11/2006 | Radke et al. | |
| 2006/0268608 A1 | 11/2006 | Noguchi et al. | |
| 2006/0294312 A1 | 12/2006 | Walmsley | |
| 2007/0025157 A1 | 2/2007 | Wan et al. | |
| 2007/0063180 A1 | 3/2007 | Asano et al. | |
| 2007/0103992 A1 | 5/2007 | Sakui et al. | |
| 2007/0104004 A1 | 5/2007 | So et al. | |
| 2007/0109858 A1 | 5/2007 | Conley et al. | |
| 2007/0124652 A1 | 5/2007 | Litsyn et al. | |
| 2007/0133298 A1 * | 6/2007 | Cernea | 365/185.22 |
| 2007/0140006 A1 * | 6/2007 | Chen et al. | 365/185.03 |
| 2007/0143561 A1 | 6/2007 | Gorobets | |
| 2007/0150694 A1 | 6/2007 | Chang et al. | |
| 2007/0168625 A1 | 7/2007 | Cornwell et al. | |
| 2007/0171714 A1 | 7/2007 | Wu et al. | |
| 2007/0171730 A1 | 7/2007 | Ramamoorthy et al. | |
| 2007/0180346 A1 | 8/2007 | Murin | |
| 2007/0223277 A1 | 9/2007 | Tanaka et al. | |
| 2007/0226582 A1 | 9/2007 | Tang et al. | |
| 2007/0226592 A1 | 9/2007 | Radke | |
| 2007/0228449 A1 | 10/2007 | Takano et al. | |
| 2007/0253249 A1 | 11/2007 | Kang et al. | |
| 2007/0253250 A1 | 11/2007 | Shibata et al. | |
| 2007/0263439 A1 | 11/2007 | Cornwell et al. | |
| 2007/0266291 A1 | 11/2007 | Toda et al. | |
| 2007/0271494 A1 | 11/2007 | Gorobets | |
| 2008/0010581 A1 | 1/2008 | Alrod et al. | |
| 2008/0028014 A1 | 1/2008 | Hilt et al. | |
| 2008/0055989 A1 | 3/2008 | Lee et al. | |
| 2008/0082897 A1 | 4/2008 | Brandman et al. | |
| 2008/0092026 A1 | 4/2008 | Brandman et al. | |
| 2008/0104309 A1 | 5/2008 | Cheon et al. | |
| 2008/0116509 A1 * | 5/2008 | Harari et al. | 257/324 |
| 2008/0126686 A1 | 5/2008 | Sokolov et al. | |
| 2008/0127104 A1 | 5/2008 | Li et al. | |
| 2008/0128790 A1 | 6/2008 | Jung | |
| 2008/0130341 A1 | 6/2008 | Shalvi et al. | |
| 2008/0137413 A1 | 6/2008 | Kong et al. | |
| 2008/0148115 A1 | 6/2008 | Sokolov et al. | |
| 2008/0158958 A1 | 7/2008 | Shalvi et al. | |
| 2008/0159059 A1 | 7/2008 | Moyer | |
| 2008/0162079 A1 | 7/2008 | Astigarraga et al. | |
| 2008/0168216 A1 | 7/2008 | Lee | |
| 2008/0168320 A1 | 7/2008 | Cassuto et al. | |
| 2008/0181001 A1 | 7/2008 | Shalvi | |
| 2008/0198650 A1 | 8/2008 | Shalvi et al. | |
| 2008/0198652 A1 | 8/2008 | Shalvi et al. | |
| 2008/0219050 A1 | 9/2008 | Shalvi et al. | |
| 2008/0225599 A1 | 9/2008 | Chae | |
| 2008/0263262 A1 | 10/2008 | Sokolov et al. | |
| 2008/0282106 A1 | 11/2008 | Shalvi et al. | |
| 2008/0285351 A1 | 11/2008 | Shlick et al. | |
| 2008/0301532 A1 | 12/2008 | Uchikawa et al. | |
| 2009/0024905 A1 | 1/2009 | Shalvi et al. | |
| 2009/0043951 A1 | 2/2009 | Shalvi et al. | |
| 2009/0072303 A9 * | 3/2009 | Prall et al. | 257/330 |
| 2009/0091979 A1 | 4/2009 | Shalvi | |
| 2009/0103358 A1 | 4/2009 | Sommer et al. | |
| 2009/0106485 A1 | 4/2009 | Anholt | |

(56) References Cited

U.S. PATENT DOCUMENTS

| | | | |
|---|---|---|---|
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", Ieee Transactions On Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp: II-369-72 vol. 2.
Michael Purser, "Introduction To Error Correcting Codes", Artech House Inc., 1995.
Ron M. Roth, "Introduction to Coding Theory", Cambridge University Press, 2006.
Todd K. Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
J.M. Portal, H. Aziza, D. Nee, "EEPROM Memory: Threshold Voltage Built In Self Diagnosis", ITC International Test Conference, Paper 2.1, Feb. 2005.
JEDEC Standard, "Stress-Test-Driven Qualification of Integrated Circuits", JEDEC Solid State Technology Association. JEDEC Standard No. 47F pp. 1-26, Dec. 2007.

\* cited by examiner

|   | Level 10 | Level 00 | Level 01 |
|---|---|---|---|
| M | 4 | 3 | 2 |
| Σ | 0.2 | 0.2 | 0.2 |

Fig. 12A

|   | Level 10 | Level 00 | Level 01 | Level 11 |
|---|---|---|---|---|
| M' | 0.7 | 0.9 | 1.1 | 1.3 |
| Σ | 0.3 | 0.3 | 0.3 | 0.3 |

Fig. 12B

SYSTEMS AND METHODS FOR DETERMINING LOGICAL VALUES OF COUPLED FLASH MEMORY CELLS

CROSS-REFERENCE TO RELATED APPLICATIONS

This application is a National Phase Application of PCT International Application No. PCT/IL2008/001234, entitled "IMPROVED SYSTEMS AND METHODS FOR DETERMINING LOGICAL VALUES OF COUPLED FLASH MEMORY CELLS", International Filing Date Sep. 17, 2008, published on Mar. 26, 2009 as International Publication No. WO 2009/037697, which in turn claims priority from US Provisional Patent Application No. 60/960,207, filed Sep. 20, 2007, and entitled "Systems and Methods for Coupling Detection in Flash Memory" and US Provisional Patent Application No. 61/071,467, filed Apr. 30, 2008 and entitled "Improved Systems and Methods for Determining Logical Values of Coupled Flash Memory Cells", all of which are incorporated herein by reference in their entirety.

Other co-pending applications include: U.S. Provisional Application No. 60/960,943, filed Oct. 22, 2007 and entitled "Systems and methods to reduce errors in Solid State Disks and Large Flash Devices", U.S. Provisional Application No. 61/071,469, filed Apr. 30, 2008 and entitled "Systems and Methods for Averaging Error Rates in Non-Volatile Devices and Storage Systems", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071,487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 60/996,782, filed Dec. 5, 2007 and entitled "Systems and Methods for Using a Training Sequence in Flash Memory", U.S. Provisional Application No. 61/064,853, filed Mar. 31, 2008 and entitled "Flash Memory Device with Physical Cell Value Deterioration Accommodation and Methods Useful in Conjunction Therewith", U.S. Provisional Application No. 61/129,608, filed Jul. 8, 2008 and entitled "A Method for Acquiring and Tracking Detection Thresholds in Flash Devices", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/006,805, filed Jan. 31, 2008 and entitled "A Method for Extending the Life of Flash Devices", U.S. Provisional Application No. 61/071,465, filed Apr. 30, 2008 and entitled "Systems and Methods for Temporarily Retiring Memory Portions", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

This invention relates to flash memory generally and more specifically to determining logical values represented therewithin.

BACKGROUND OF THE INVENTION

A variety of conventional flash memory devices are described in the following US Patents and patent documents: U.S. Pat. Nos. 6,751,766; 7,196,946; 7,203,874; US 2006/0101193 A1; US 2007/0180346 A1.

The state of the art is believed to be described by the following publications inter alia:

[1] "Interleaving policies for flash memory", U.S. Pat. No. 20070168625

[2] "Minimization of FG-FG coupling in flash memory", U.S. Pat. No. 6,996,004

[3] "Compensating for coupling during read operations on non-volatile memory", U.S. Pat. No. 2006221692

[4] Construction of Rate (nμ1)/n Punctured Convolution Code with Minimum Required SNR Criterion, Pil J. Lee, IEEE Trans. On Comm. Vol. 36, NO. 10, October 1988

[5] "Introduction to Coding Theory", Ron M. Roth, Cambridge University Press, 2006, particularly chapters 5 and 8 re BCH.

[6] "Sensing margin analysis of MLC flash memories using a novel unified statistical model", Young-Gu Kim, Quality Electronic Design, 2006. ISQED '06. 7th International Symposium on . . . .

[7] "Extraction of the gate capacitance coupling coefficient in floating gate non-volatile memories: Statistical study of the effect of mismatching between floating gate memory and reference transistor in dummy cell extraction methods", Quentin Rafhay, Solid-State Electronics Volume 51, Issue 4, April 2007, Pages 585-592.

[8] "Statistical simulations for flash memory reliability analysis and prediction", Larcher, L, Electron Devices, IEEE Transactions on, Volume 51, Issue 10, October 2004 Page(s): 1636-1643.

Conventional flash memory technology is described in the following textbooks inter alia:

[9] Paulo Cappelletti, Clara Golla, Piero Olivo, Enrico Zanoni, "Flash Memories", Kluwer Academic Publishers, 1999

[10] G. Campardo, R. Micheloni, D. Novosel, "CLSI-Design of Non-Volatile Memories", Springer Berlin Heidelberg N.Y., 2005.

[11] Introduction to Probability, Charles M. Grinstead, Swarthmore College, J. Laurie Snell, Dartmouth College The disclosures of all publications and patent documents mentioned in the specification, and of the publications and patent documents cited therein directly or indirectly, are hereby incorporated by reference. U.S. Pat. No. 6,996,004 entitled "Minimization of FG-FG coupling in flash memory" describes that "multiple passes of the loop of program verify and programming steps are performed for minimizing the effects of FG-FG coupling during programming a flash memory device . . . [F]or programming a group of at least one flash memory cell of an array, a first pass of program verify and programming steps is performed until each flash memory cell of the group attains a threshold voltage that is at least X % of a program verify level but less than the program verify level. Then, a second pass of program verify and programming steps are performed until each flash memory cell of the group attains substantially the program verify level for the threshold voltage."

The disclosures of all publications and patent documents mentioned in the specification, and of the publications and patent documents cited therein directly or indirectly, are hereby incorporated by reference.

SUMMARY OF THE INVENTION

According to one aspect of the invention, there is provided a method for reading cells of a flash memory, said method comprising comparing a charge level of a first individual cell to a first plurality of charge level boundary points, thereby to determine a first program level of said first individual cell, and subsequently comparing a second charge level of a second individual cell to a second plurality of charge level boundary points, wherein said first plurality of boundary points depends on at least one charge level of at least one neighbor of said first cell and said second plurality of boundary points depends on at least one charge level of at least one neighbor of said second cell such that said first and second pluralities of boundary points differ.

According to other aspects of the invention, there is provided a method for determining program levels useful for reading cells of a flash memory, said method comprising detecting charge levels for said cells, obtaining joint conditional probability densities for a plurality of combinations of program levels of said cells, and determining program levels for said cells respectively such that an aggregated joint probability value of said joint conditional probability densities is maximized.

According to other aspects of the invention, there is provided a method for determining program levels useful for reading cells of a flash memory, said method comprising detecting charge levels for said cells, obtaining a linear dependency function which refers to at least one of the cells and at least one cell coupled thereto, computing an estimated charge level based on the linear dependency function, and determining program levels for said cells respectively such that the aggregated standard variation between a corresponding estimated charge level and the detected charge level of each cell is minimized.

According to other aspects of the invention, there is provided a method for determining program levels useful for reading cells of a flash memory, said method comprising obtaining charge level initial threshold values, detecting charge levels for said cells using said initial threshold values, determining a program level for each of said cells based on the detected charge levels, including, for each of at least one individual of said cells, performing iteratively, at least once, computing new threshold values for the measurement of charge level of said individual cell based on the previous detected charge level of said individual cell and on previous determined program levels of said individual cell and of at least one cell adjacent thereto, detecting charge levels for said individual cell based on said new threshold values, and determining a new program level for said individual cell based on the last detected charge levels of said individual cell.

According to other aspects of the invention, there is provided a method for determining program levels useful for reading cells of a flash memory, said method comprising obtaining charge level initial threshold values, detecting charge levels for said cells using said initial threshold values, determining voltage regions for each of said cells based on the detected charge levels, for each of at least one individual of said cells, performing iteratively, at least once, computing new threshold values for the measurement of charge levels of said individual cell based on the detected voltage regions of said individual cell and at least one cell adjacent thereto, detecting charge levels for said individual cell based on said new threshold values, determining a new voltage region for at least said individual cell based on the last determined charge level of said individual cell and the determined voltage regions of at least one other cell, and determining the program levels based on the last determined voltage regions.

According to other aspects of the invention, there is provided a method of reading cells in a flash memory, said memory comprising sorting each of a plurality of cells into several categories depending on whether the cells' charge levels are above or below predetermined charge level boundary points, wherein said boundary points are independent of the charge levels in said cells, and determining each cell's program level as a function of at least the category to which it and at least one neighboring cell thereof, belong.

According to other aspects of the invention, there is provided a system for reading cells of a flash memory, said system comprising a micro-controller and an array of cells wherein said micro-controller is operatively configured to compare a charge level of a first individual cell to a first plurality of charge level boundary points, thereby to determine a first program level of said first individual cell, and subsequently comparing a second charge level of a second individual cell to a second plurality of charge level boundary points, wherein said first plurality of boundary points depends on at least one charge level of at least one neighbors of said first cell and said second plurality of boundary points depends on at least one charge level of at least one neighbors of said second cell such that said first and second pluralities of boundary points differ.

According to other aspects of the invention, there is provided a system for determining program levels useful for reading cells of a flash memory, said system comprising a micro-controller and an array of cells wherein said micro-controller is operatively configured to detect charge levels for said cells, obtain joint conditional probability densities for a plurality of combinations of program levels of said cells, and determine program levels for said cells respectively such that an aggregated joint probability value of said joint conditional probability densities is maximized.

According to other aspects of the invention, there is provided a system for determining program levels useful for reading cells of a flash memory, said system comprising a micro-controller and an array of cells wherein said micro-controller is operatively configured to detect charge levels for said cells, obtain a linear dependency function which refers to at least one of the cells and at least one cell coupled thereto, compute an estimated charge level based on the linear dependency function, and determine program levels for said cells respectively such that the aggregated standard variation between a corresponding estimated charge level and the detected charge level of each cell is minimized.

According to other aspects of the invention, there is provided a system for determining program levels useful for reading cells of a flash memory, said system comprising a micro-controller and an array of cells wherein said micro-controller is operatively configured to obtain charge level initial threshold values, detect charge levels for said cells using said initial threshold values, determine a program level for each of said cells based on the detected charge levels, including, for each of at least one individual of said cells, perform iteratively, at least once, a computation of new threshold values for the measurement of charge level of said individual cell based on the previous detected charge level of said individual cell and on previous determined program levels of said individual cell and of at least one cell adjacent thereto, detect charge levels for said individual cell based on said new threshold values, and determine a new program level for said individual cell based on the last detected charge levels of said individual cell.

According to other aspects of the invention, there is provided a system for determining program levels useful for reading cells of a flash memory, said system comprising a micro-controller and an array of cells wherein said micro-controller is operatively configured to obtain charge level initial threshold values, to detect charge levels for said cells using said initial threshold values, to determine voltage regions for each of said cells based on the detected charge levels, and for each of at least one individual of said cells, perform iteratively, at least once, a computation of new threshold values for the measurement of charge levels of said individual cell based on the detected voltage regions of said individual cell and at least one cell adjacent thereto, to determine a new voltage region for at least said individual cell based on the last determined charge level of said individual cell and the determined voltage regions of at least one other cell, and to determine the program levels based on the last determined voltage regions.

According to other aspects of the invention, there is provided a system for reading cells of a flash memory, said system comprising a micro-controller and an array of cells wherein said micro-controller is operatively configured to sort each of a plurality of cells into several categories depending on whether the cells' charge levels are above or below predetermined charge level boundary points, wherein said boundary points are independent of the charge levels in said cells, and determine each cell's program level as a function of at least the category to which it and at least one neighboring cell thereof, belong.

According to other aspects of the invention, there is provided a program storage device readable by machine, tangibly embodying a program of instructions executable by the machine to perform a method for reading cells of a flash memory, said method comprising comparing a charge level of a first individual cell to a first plurality of charge level boundary points, thereby to determine a first program level of said first individual cell, and subsequently comparing a second charge level of a second individual cell to a second plurality of charge level boundary points, wherein said first plurality of boundary points depends on at least one charge level of at least one neighbors of said first cell and said second plurality of boundary points depends on at least one charge level of at least one neighbors of said second cell such that said first and second pluralities of boundary points differ.

According to other aspects of the invention, there is provided a computer program product comprising a computer useable medium having computer readable program code embodied therein for reading cells of a flash memory, said computer program product comprising computer readable program code for causing the computer to compare a charge level of a first individual cell to a first plurality of charge level boundary points, thereby to determine a first program level of said first individual cell, and subsequently computer readable program code for causing the computer to compare a second charge level of a second individual cell to a second plurality of charge level boundary points, wherein said first plurality of boundary points depends on at least one charge level of at least one neighbors of said first cell and said second plurality of boundary points depends on at least one charge level of at least one neighbors of said second cell such that said first and second pluralities of boundary points differ.

According to other aspects of the invention, there is provided a program storage device readable by machine, tangibly embodying a program of instructions executable by the machine to perform a method for determining program levels useful for reading cells of a flash memory, said method comprising detecting charge levels for said cells, obtaining joint conditional probability densities for a plurality of combinations of program levels of said cells, and determining program levels for said cells respectively such that an aggregated joint probability value of said joint conditional probability densities is maximized.

According to other aspects of the invention, there is provided a computer program product comprising a computer useable medium having computer readable program code embodied therein for determining program levels useful for reading cells of a flash memory, said computer program product comprising computer readable program code for causing the computer to detect charge levels for said cells, computer readable program code for causing the computer to obtain joint conditional probability densities for a plurality of combinations of program levels of said cells, and a computer readable program code for causing the computer to determine program levels for said cells respectively such that an aggregated joint probability value of said joint conditional probability densities is maximized.

According to other aspects of the invention, there is provided a program storage device readable by machine, tangibly embodying a program of instructions executable by the machine to perform a method for determining program levels useful for reading cells of a flash memory, said method comprising detecting charge levels for said cells, obtaining a linear dependency function which refers to at least one of the cells and at least one cell coupled thereto, computing an estimated charge level based on the linear dependency function, and determining program levels for said cells respectively such that the aggregated standard variation between a corresponding estimated charge level and the detected charge level of each cell is minimized.

According to other aspects of the invention, there is provided a computer program product comprising a computer useable medium having computer readable program code embodied therein for determining program levels useful for reading cells of a flash memory, said computer program product comprising a computer readable program code for causing the computer to detect charge levels for said cells, a computer readable program code for causing the computer to obtain a linear dependency function which refers to at least one of the cells and at least one cell coupled thereto, a computer readable program code for causing the computer to compute an estimated charge level based on the linear dependency function, and a computer readable program code for causing the computer to determine program levels for said cells respectively such that the aggregated standard variation between a corresponding estimated charge level and the detected charge level of each cell is minimized.

According to other aspects of the invention, there is provided a program storage device readable by machine, tangibly embodying a program of instructions executable by the machine to perform a method for determining program levels useful for reading cells of a flash memory, said method comprising obtaining charge level initial threshold values, detecting charge levels for said cells using said initial threshold values, determining a program level for each of said cells based on the detected charge levels, including, for each of at least one individual of said cells, performing iteratively, at least once, computing new threshold values for the measurement of charge level of said individual cell based on the previous detected charge level of said individual cell and on previous determined program levels of said individual cell and of at least one cell adjacent thereto, detecting charge levels for said individual cell based on said new threshold values, and determining a new program level for said individual cell based on the last detected charge levels of said individual cell.

According to other aspects of the invention, there is provided a computer program product comprising a computer useable medium having computer readable program code embodied therein for determining program levels useful for reading cells of a flash memory, said computer program product comprising a computer readable program code for causing the computer to obtain charge level initial threshold values, a computer readable program code for causing the computer to detect charge levels for said cells using said initial threshold values, a computer readable program code for causing the computer to determine a program level for each of said cells based on the detected charge levels, including, for each of at least one individual of said cells, performing iteratively, at least once, computing new threshold values for the measurement of charge level of said individual cell based on the previous detected charge level of said individual cell and on previous determined program levels of said individual cell and of at least one cell adjacent thereto, detecting charge levels for said individual cell based on said new threshold values, and determining a new program level for said individual cell based on the last detected charge levels of said individual cell.

According to other aspects of the invention, there is provided a program storage device readable by machine, tangibly embodying a program of instructions executable by the machine to perform a method for determining program levels useful for reading cells of a flash memory, said method comprising obtaining charge level initial threshold values, detecting charge levels for said cells using said initial threshold values, determining voltage regions for each of said cells based on the detected charge levels, for each of at least one individual of said cells, performing iteratively, at least once, computing new threshold values for the measurement of charge levels of said individual cell based on the detected voltage regions of said individual cell and at least one cell adjacent thereto, detecting charge levels for said individual cell based on said new threshold values, determining a new voltage region for at least said individual cell based on the last determined charge level of said individual cell and the determined voltage regions of at least one other cell, and determining the program levels based on the last determined voltage regions.

According to other aspects of the invention, there is provided a computer program product comprising a computer useable medium having computer readable program code embodied therein for determining program levels useful for reading cells of a flash memory, said computer program product comprising computer readable program code for causing the computer to obtain charge level initial threshold values, a computer readable program code for causing the computer to detect charge levels for said cells using said initial threshold values, computer readable program code for causing the computer to determine voltage regions for each of said cells based on the detected charge levels, computer readable program code for causing the computer to perform iteratively, at least once, for each of at least one individual of said cells, computing new threshold values for the measurement of charge levels of said individual cell based on the detected voltage regions of said individual cell and at least one cell adjacent thereto, detecting charge levels for said individual cell based on said new threshold values, and determining a new voltage region for at least said individual cell based on the last determined charge level of said individual cell and the determined voltage regions of at least one other cell, and a computer readable program code for causing the computer to determine the program levels based on the last determined voltage regions.

According to other aspects of the invention, there is provided a program storage device readable by machine, tangibly embodying a program of instructions executable by the machine to perform a method of reading cells of a flash memory, said method comprising sorting each of a plurality of cells into several categories depending on whether the cells' charge levels are above or below predetermined charge level boundary points, wherein said boundary points are independent of the charge levels in said cells, and determining each cell's program level as a function of at least the category to which it and at least one neighboring cell thereof, belong.

According to other aspects of the invention, there is provided a computer program product comprising a computer useable medium having computer readable program code embodied therein of reading cells of a flash memory, said computer program product comprising computer readable program code for causing the computer to sort each of a plurality of cells into several categories depending on whether the cells' charge levels are above or below predetermined charge level boundary points, wherein said boundary points are independent of the charge levels in said cells, and a computer readable program code for causing the computer to determine each cell's program level as a function of at least the category to which it and at least one neighboring cell thereof, belong.

According to other aspects of the invention, there is provided a method for determining program levels useful for reading cells of a flash memory, said method comprising detecting charge levels for said cells, obtaining a set of coefficients $\alpha_j$ that minimize the aggregated standard variation $(L_1 - \hat{L}_1)$, iteratively, as long as a criterion is met, computing an estimation of the charge level for each of said cells according to:

$$\hat{L}i = \alpha_i V_{Ti} + \sum_{j=1, j\neq i}^{k} \alpha_j L_j.$$

The following terms may be construed either in accordance with any definition thereof appearing in the prior art literature or in accordance with the specification, or as follows:

Block: a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor. n may or may not be an integer. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Cycling: Repeatedly writing new data into flash memory cells and repeatedly erasing the cells between each two writing operations.

Decision regions: Regions extending between adjacent decision levels, e.g. if decision levels are 0, 2 and 4 volts respectively, the decision regions are under 0 V, 0 V –2 V, 2V –4 V, and over 4 V.

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating 2 exp n distinguishable levels of a typically continuous physical value such as charge, where n may or may not be an integer.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory, devices with any suitable number of levels per cell, such as but not limited to 2, 4, or 8 (as in the embodiment illustrated herein).

Mapping: basic cell-level writing function in which incoming digital n-tuple is mapped to a program level by inducing a program level in the cell, having a predetermined correspondence to the incoming logical value.

Page: A portion, typically 512 or 2048 or 4096 bytes in size, of a flash memory e.g. a NAND or NOR flash memory device. Writing can be performed page by page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages.

Precise read, soft read: Cell threshold voltages are read at a precision (number of bits) greater than the number of Mapping levels (2^n). The terms precise read or soft read are interchangeable: In contrast, in "hard read", cell threshold voltages are read at a precision (number of bits) smaller than the number of Mapping levels (2^n where n=number of bits per cell).

Present level, Charge level: The amount of charge in the cell. The Amount of charge currently existing in a cell, at the present time, as opposed to "program level", the amount of charge originally induced in the cell (i.e. at the end of programming).

Program: same as "write".

Program level (programmed level, programming level): amount of charge originally induced in a cell to represent a given logical value, as opposed to "present level".

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Resolution: Number of levels in each cell, which in turn determines the number of bits the cell can store; typically a cell with 2^n levels stores n bits. Low resolution (partitioning the window, W, of physical values a cell can assume into a small rather than large number of levels per cell) provides high reliability.

Retention: of original physical levels induced in the cells; retention is typically below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Symbol: Logical value

Threshold level: the voltage (e.g.) against which the charge level of a cell is measured. For example, a cell may be said to store a particular digital n-tuple D if the charge level or other physical level of the cell falls between two threshold values T.

Unless specifically stated otherwise, as apparent from the following discussions, it is appreciated that throughout the specification discussions, utilizing terms such as, "processing", "computing", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In this specification, the terms "decision levels" and "threshold levels" are used interchangeably. "Reliably storing" and "reliable" are used to indicate that certain information is stored with high reliability in the sense that it can be expected to be read without error throughout the guaranteed lifetime of the flash memory device.

The apparatus of the present invention may include, according to certain embodiments of the present invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the present invention, a program as above which may be written in any conventional programming language, and optionally a machine for executing the program such as but not limited to a general purpose computer which may optionally be configured or activated in accordance with the teachings of the present invention.

Any trademark occurring in the text or drawings is the property of its owner and occurs herein merely to explain or illustrate one example of how an embodiment of the invention may be implemented.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 12A is a Table showing Gaussian parameters for distributions of Levels 10, 00 and 01, used in an example for performing the method illustrated in FIG. 10;

FIG. 12B is a Table showing Gaussian parameters for the Erase state (Level 11) distribution, used in an example for performing the method illustrated in FIG. 10;

DETAILED DESCRIPTION OF EMBODIMENTS

Today's Flash memory devices store information as charge in "cells", each made of either a floating gate transistor or an NROM transistor. In single-level cell (SLC) devices, each cell stores only one bit of information. Multi-level cell (MLC) devices can store more than one bit per cell by choosing between multiple levels of electrical charge to apply to the floating gates of their cells. The amount of charge is then measured by a detector, by comparing the voltage of the transistor gate (also known as charge level and denoted $V_T$) to a decision threshold voltage (also known as threshold level or charge level boundary point and denoted $V_D$. These terms are used interchangeably in the following text). The amount of charge is then used to determine the "bin" (also termed "category") to which the cell belongs that can be directly correlated with the programmed level of the cell. The program level is then translated to the logical value of that cell. Due to inaccuracies during the programming procedure and charge loss due to time and temperature (also known as retention), the measured levels suffer from a random distortion.

Figure 1:
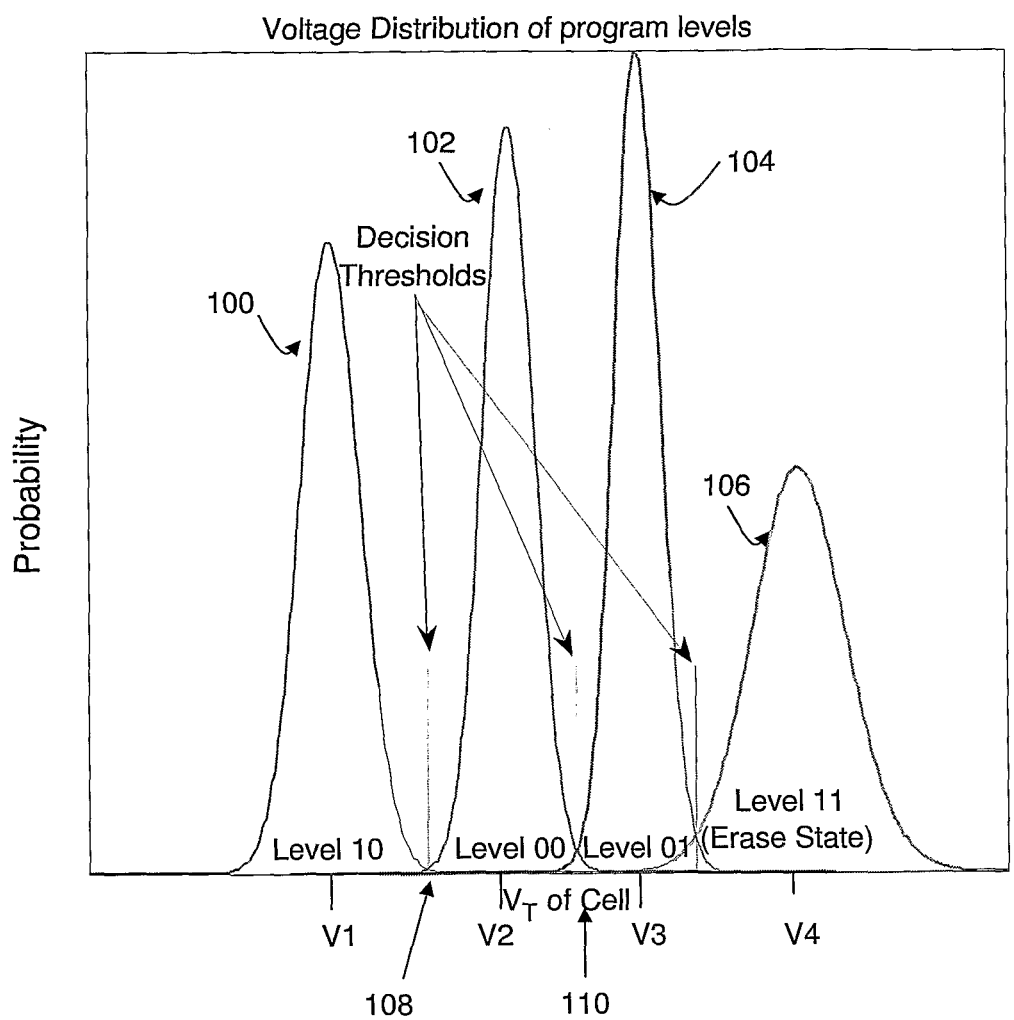
FIG. 1 is a prior art graph illustrating an example of four separate charge level probability densities (100, 102, 104 and 106) of a cell.

FIG. 1 is a prior art graph illustrating an example of four separate charge level probability densities (100, 102, 104 and 106) of a cell. The cell can be programmed with one of four corresponding program levels (V1, V2, V3 and V4) that correspond to four logical values (10, 00, 01 and 11, respectively). For each distribution curve, the Y-axis represents the probability that the cell was programmed to the corresponding program level, given the value of the charge level $V_T$ (represented by the x-axis). The voltage window (W) is the voltage difference between the means of the two extreme distributions. The difference between the means of two near distributions is marked by D. Categories are defined by the corresponding boundary points. For example, charge level boundary point 108 defines a category corresponding to cells having measured charge levels that are less than boundary points 108. Charge level boundary points 108 and 110 define a category corresponding to cells having measured charge levels that are greater than boundary point 108 and less than boundary point 110.

The flash memory device's aging results from program and erase cycles count and retention time. The flash memory device's erase sectors and pages are not uniform in the amount of aging they experience. The aging process is apparent by comparing prior art FIGS. 2A-2B. It may result in loss of the window size and increase in each level noise variance. The consequence is loss in the signal-to-noise ratio and increase in number of error bits.

The window is divided into multi decision regions and the decision level is typically tuned at each region.

Figure 2A:
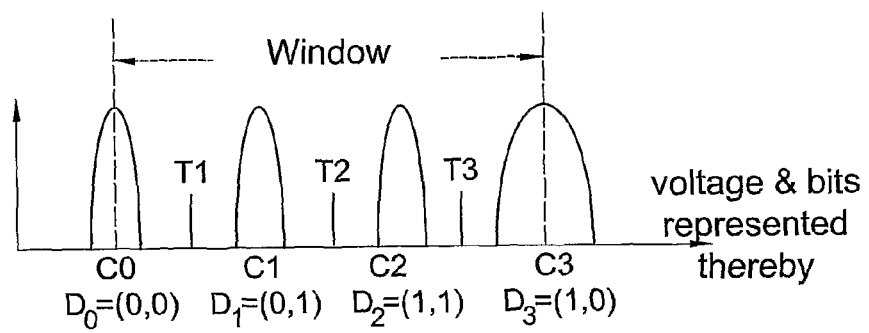
FIG. 2A-B are graphs of manufacturer-defined initial cell voltage distributions (FIG. 2A), which apply to a flash memory device which has yet to undergo cycling and retention and of cell voltage distributions (FIG. 2B) which apply to a flash memory device which has undergone cycling and retention.
Figure 2B:
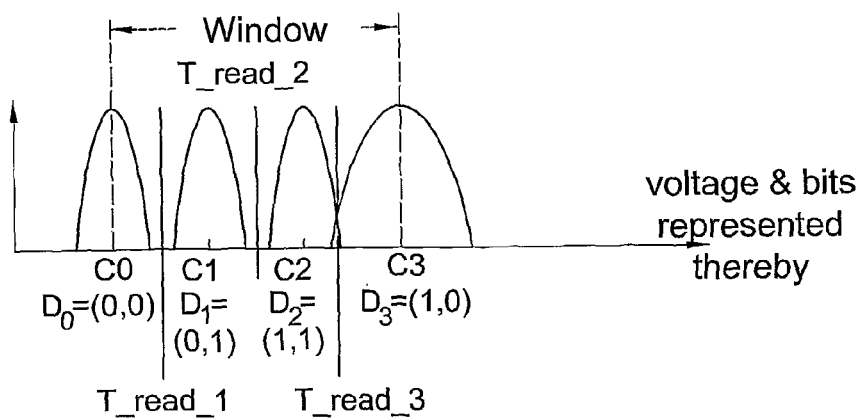

FIG. 2A shows original decision regions, delimited by the original threshold values; if the cell voltage is above decision voltage #1 but less then decision voltage #2, the reading circuitry decides that the stored bits are (0,1). Optimal tuning of thresholds, also termed herein "computation of threshold levels", reduces the number of error bits.

The cell's programmed level may be determined using several methods. One method is to apply a voltage to the cell's gate and measure if the cell conducts current. The cell has a certain voltage such that if voltage above it is applied to the gate, the gate will conduct. Below this certain voltage the gate will not conduct current. As the amount of charge in the cell changes this threshold voltage, the charge may be inferred by determining at which voltage the cells starts to conduct current. Thus, the programmed level is determined by iteratively applying different voltages (threshold levels) to the gate and measuring whether the cell conducts or not. Another method is based on the fact that when applying a voltage above the threshold voltage, the cell conducts current and the amount of current depends on the difference between the applied voltage and the cell's voltage. As the cell's voltage changes as a function of the amount of charge in the cell, the charge level may be inferred by measuring the current going through the cell. Thus, the programmed level may be obtained by simultaneously comparing the conducted current with a given set of fixed currents distinguishing between all programmed levels. In other words, each cell's programmed level is determined by simultaneously comparing the $V_T$ level against several decision threshold levels. For example, if there are four possible programmed levels, the cell's $V_T$ is simultaneously compared against three threshold levels which divide the voltage axis to four regions, as demonstrated in FIG. 1.

In general, if there are L possible programmed levels, then L−1 decision threshold levels are used. As the probability densities extend beyond the decision threshold levels, there is a probability of detection error, i.e. detecting the wrong program level.

Apart from inaccuracies resulting from the programming and retention processes, distortion during the $V_T$ level read also occurs due to cell coupling. The $V_T$ level of one cell may be affected ("coupled") to the $V_T$ level of one or more neighboring cells. (see "Non-Volatile Memory Technology—Today and Tomorrow", Chih-Yuan, Tao-Cheng Lu, and Rich Liu, Proceedings of $13^{th}$ IPFA 2006, Singapore; and also "8 Gb MLC (Multi-Level Cell) NAND Flash Memory using 63 nm Process Technology", Jong-Ho Park, Sung-Hoi Hur, Joon-Hee Lee, Jin-Taek Park, Jong-Sun Set, Jong-Won Kim, Sang-Bin Song, Jung-Young Lee, Ji-Hwon Lee, Suk-Joon Son, Yong-Seok Kim, Min-Cheol Park, Soo-Jin Chai, Jung-Dal Choi, U-In Chung, Joo-Tae Moon, Kyeong-Tae Kim, Kinam Kim and Byung-Il Ryu, IEDM 04, pp. 873-876).

Figure 3:
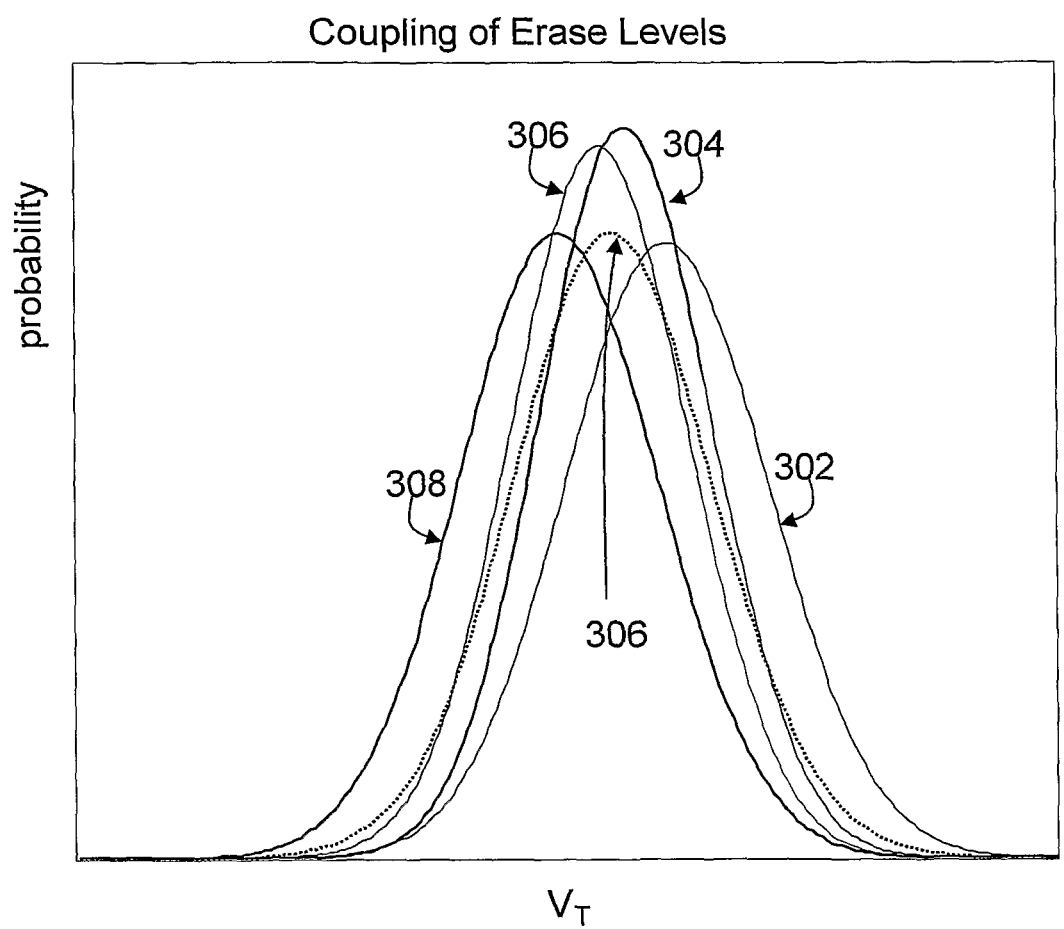
FIG. 3 is a prior art graph demonstrating a simplified case, involving one additional coupled cell, in which the coupling creates an even wider distribution for the erase state shown in FIG. 1.

In Floating-Gate technology, cell coupling occurs due to cell to cell capacitance of neighboring cells. In NROM technology, cell coupling occurs between the right and left halves of the cell. In both cases the coupling becomes worse as the dimensions of the technology decrease. FIG. 3 is a prior art graph demonstrating a simplified case, involving one additional coupled cell, in which the coupling creates an even wider distribution for the erase state shown in FIG. 1. FIG. 3 demonstrates four possible charge level probability densities for a cell which was programmed to the erase state. The four curves are each corresponding to a different charge level of a neighboring coupled cell. Curve 302, 304, 306 and 308 are the cell's four possible charge level probability densities that match the neighboring coupled cell's logical values "11", "01", "00" and "10" respectively. That is, the distribution of the erase state in FIG. 1 is a combination of several distributions, shifted with respect to one another, depending on the program level of the coupled cell. In most cases, the shift due to coupling is linear with respect to the coupled cell program level.

Certain embodiments of the present invention seek to reduce probability of charge level detection error in a Flash memory cell using joint program level detection in several coupled cells.

According to certain embodiments of the present invention, joint program level detection is performed for all coupled cells computationally simultaneously. In certain other embodiments, joint program level detection is performed simultaneously for at least one cell of a group of coupled cells. In one embodiment of joint program level detection, only one cell is considered during the detection procedure—this is a one-dimensional detection. According to another embodiment of the invention, joint program level detection is performed on both halves of an NROM cell (in the case of NROM, where the two halves of the cell are coupled), or on two cells to decrease the probability of detection error. This type of detection will be referred to as a two-dimensional detection. If more cells are involved, the detection will be termed a multi-dimensional detection of the program levels, where the number of dimensions depends on the number of cells computationally simultaneously detected. Note that the term neighboring cell, neighbor and coupled cell are used interchangeably throughout the text to denote a cell that has the potential to affect the charge level of a second cell in the cell array.

Reference is now made to FIGS. 4A-E which are each a simplified functional block diagram of an improved flash memory system capable of determining program level of a cell, constructed and operative in accordance with respective embodiments of the present invention. The systems of FIGS. 4A-E typically comprise a host (outside application) 100 and associated interface and interface controller, interacting with a flash memory device 105. The flash memory device 105 includes a micro-controller 110 and an array of cells including at least one erase sector 120, each erase sector including at least one physical page 130, each page including a plurality of cells 140. The flash memory device also includes circuitry for erasing data from cells 140, writing data into cells, and reading data from cells, referenced herein as erasing circuitry 150, writing circuitry 160 and reading circuitry 170 respectively. According to certain embodiments of the present invention, micro-controller 110 is operatively configured to determine the program level of a cell, as will be further explained below.

Figure 4A:
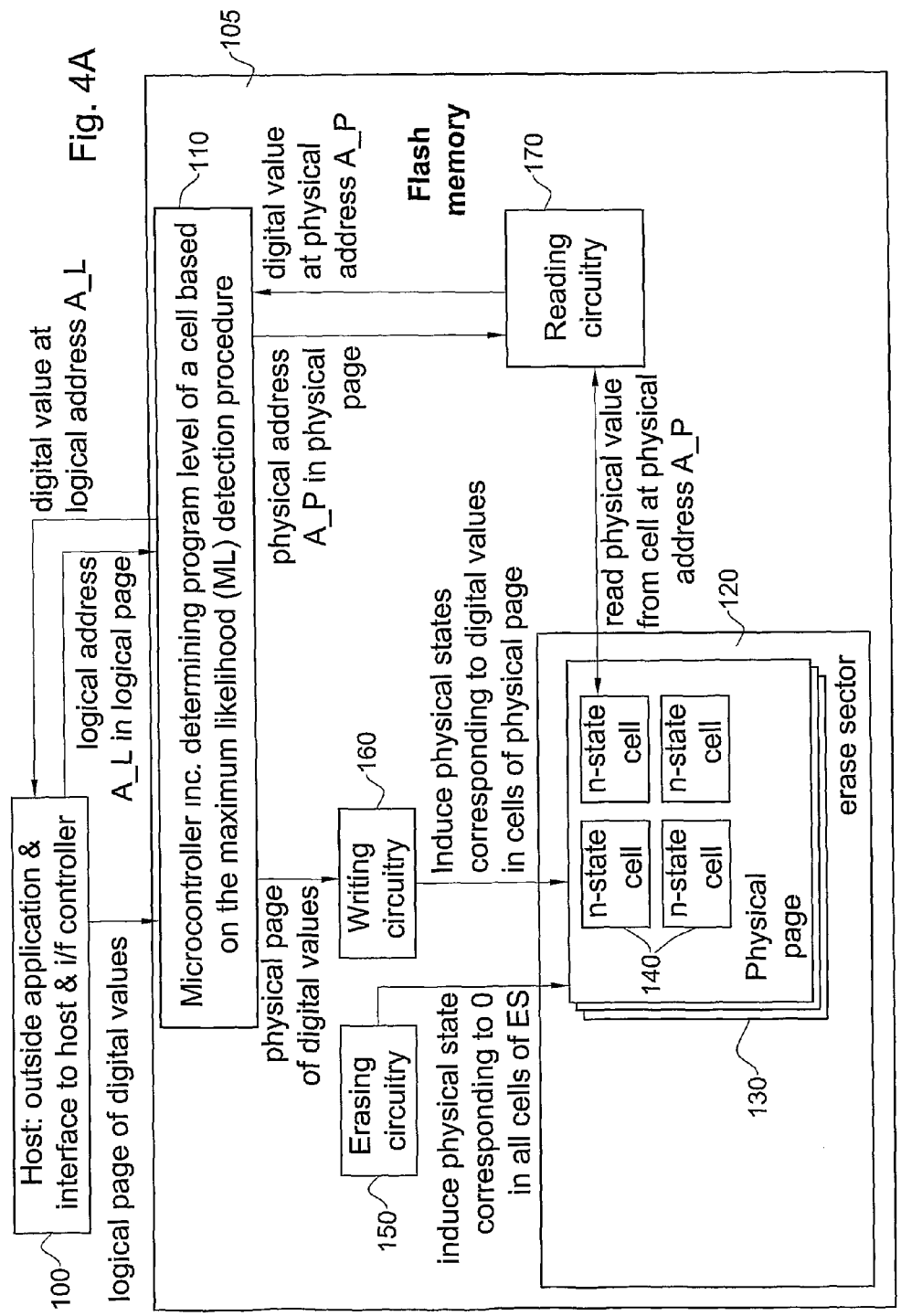
FIG. 4A is a simplified functional block diagram of an improved flash memory system capable of determining a program level of a cell based on its own and its coupled cells charge levels, including determining program level of a cell based on a first maximum likelihood (ML) detection procedure such as that described in detail below with reference to FIG. 7, the system being constructed and operative in accordance with certain embodiments of the present invention.

FIG. 4A is a simplified functional block diagram of an improved flash memory system capable of determining program level of a cell based on its own and its coupled cells charge levels, including determining program level of a cell based on a first maximum likelihood (ML) detection procedure, constructed and operative in accordance with certain embodiments of the present invention.

Figure 4B:
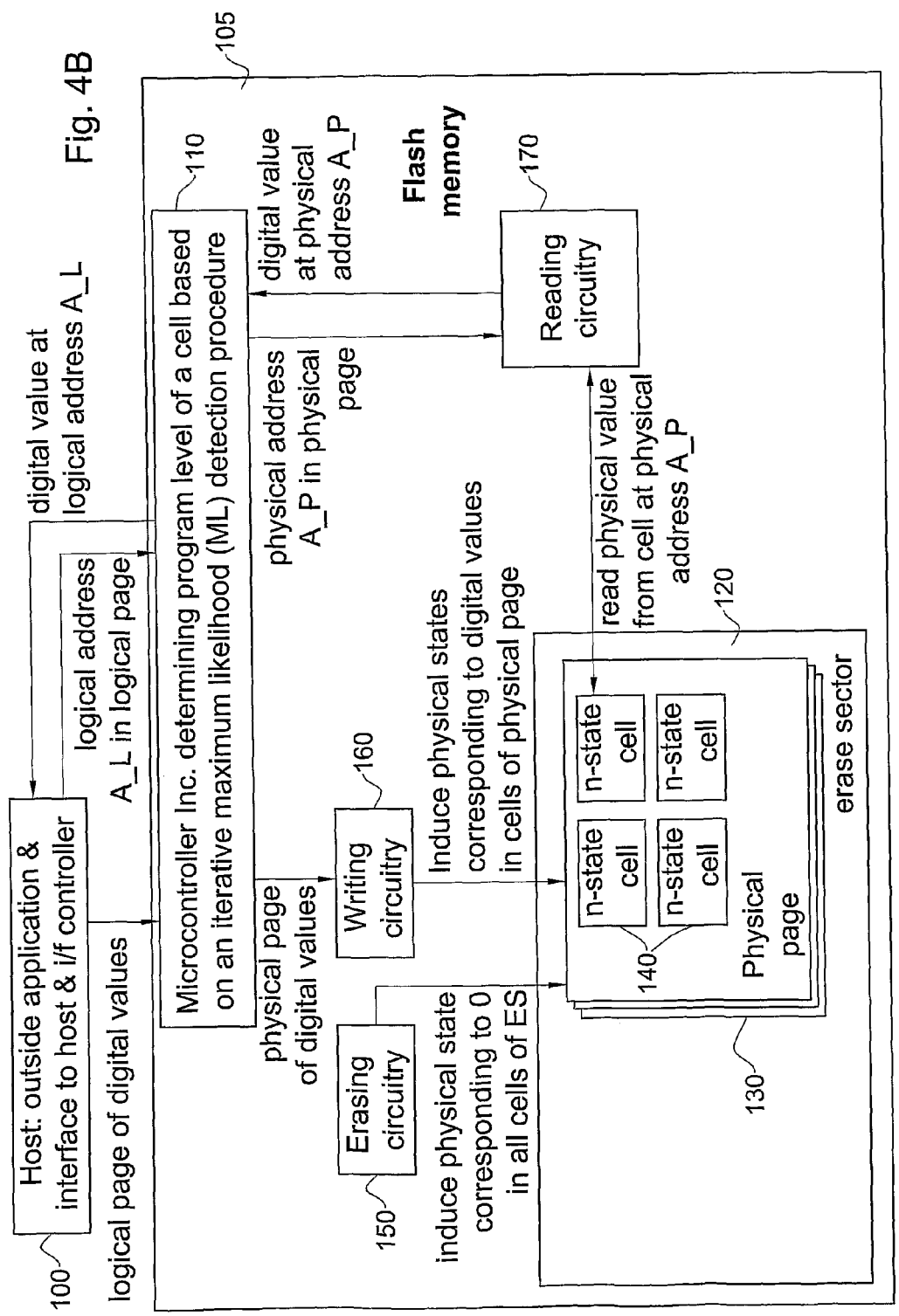
FIG. 4B is a simplified functional block diagram of an improved flash memory system capable of determining program level of a cell based on its own and its coupled cells charge levels, including determining program level of a cell based on a second, iterative maximum likelihood (ML) detection procedure such as that described in detail below with reference to FIG. 8, the system being constructed and operative in accordance with certain embodiments of the present invention.

FIG. 4B is a simplified functional block diagram of an improved flash memory system capable of determining program level of a cell based on its own and its coupled cells charge levels, including determining program level of a cell based on a second, iterative maximum likelihood (ML) detection procedure, as further elaborated below, constructed and operative in accordance with certain embodiments of the present invention.

Figure 4C:
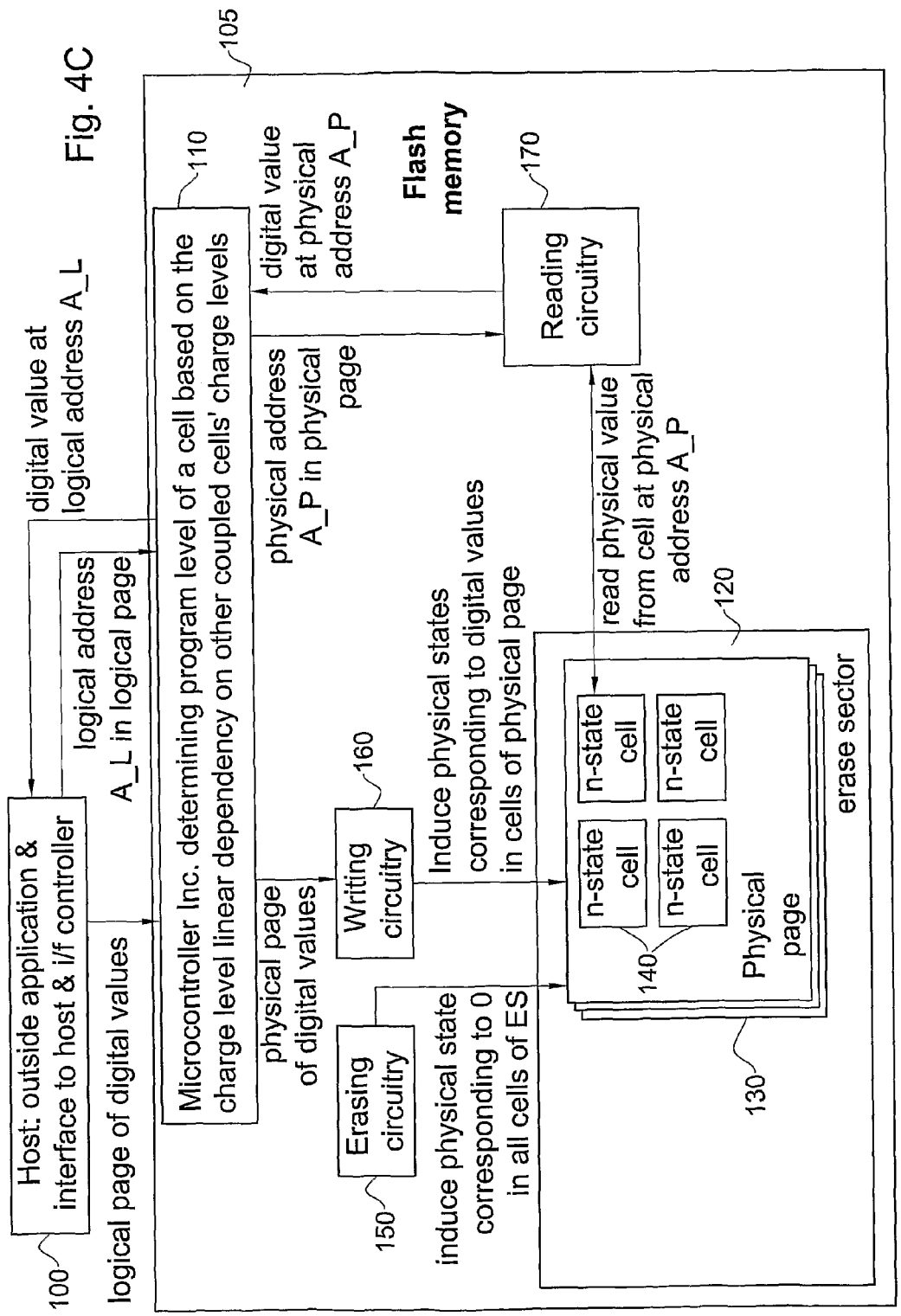
FIG. 4C is a simplified functional block diagram of an improved flash memory system capable of determining program level of a cell wherein program level determination is based on the cell's charge level's linear dependency on other coupled cells' charge levels e.g. as described in detail below with reference to FIG. 9, the system being constructed and operative in accordance with certain embodiments of the present invention.

FIG. 4C is a simplified functional block diagram of an improved flash memory system capable of determining program level of a cell in which its charge level linear dependency on other coupled cells' charge levels is employed, as further elaborated below, constructed and operative in accordance with certain embodiments of the present invention.

Figure 4D:
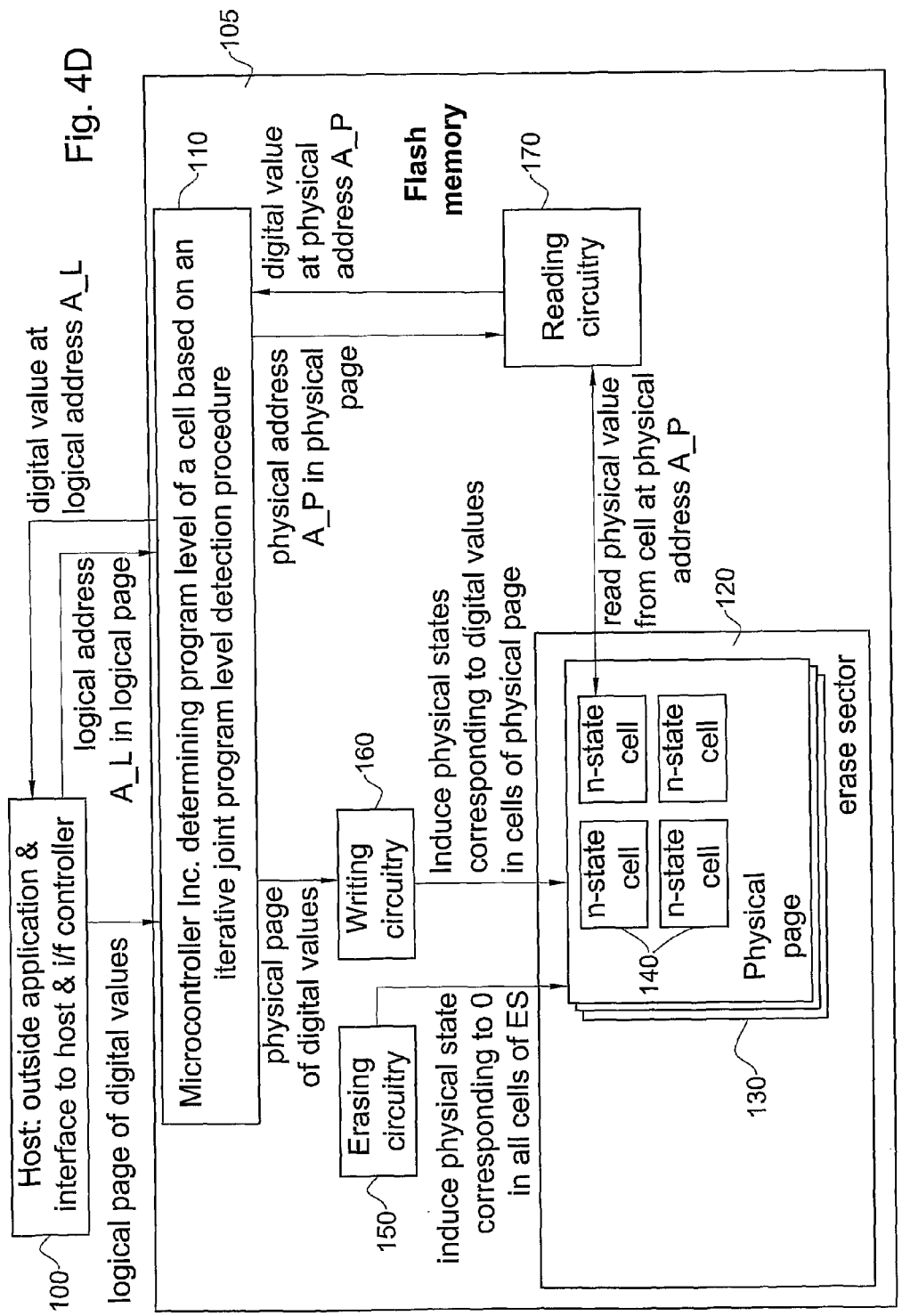
FIG. 4D is a simplified functional block diagram of an improved flash memory system capable of determining program level of a cell based on its own and its coupled cells charge levels, including determining program level of a cell based on an iterative joint program level detection procedure such as that described in detail below with reference to FIG. 10, the system being constructed and operative in accordance with certain embodiments of the present invention.

FIG. 4D is a simplified functional block diagram of an improved flash memory system capable of determining program level of a cell based on its own and its coupled cells charge levels, including determining program level of a cell based on an iterative joint program level detection procedure, as further elaborated below, constructed and operative in accordance with certain embodiments of the present invention.

Figure 4E:
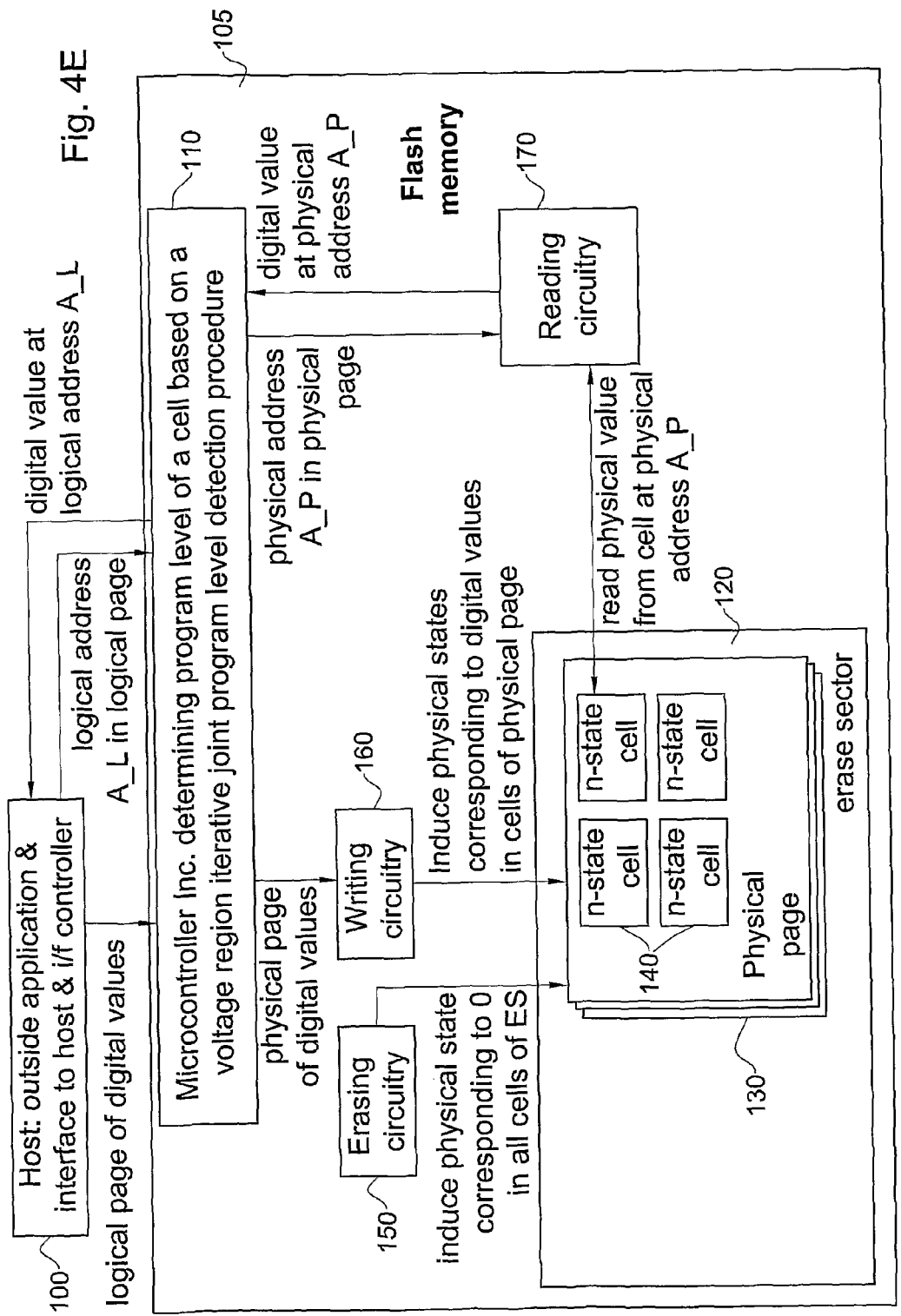
FIG. 4E is a simplified functional block diagram of an improved flash memory system capable of determining program level of a cell based on its own and its coupled cells charge levels, including determining program level of a cell based on a voltage region iterative joint program level detection procedure such as that described in detail below with reference to FIG. 13, the system being constructed and operative in accordance with certain embodiments of the present invention.

FIG. 4E is a simplified functional block diagram of an improved flash memory system capable of determining program level of a cell based on its own and its coupled cells charge levels, including determining program level of a cell based on a voltage region iterative joint program level detection procedure, as further elaborated below, constructed and operative in accordance with certain embodiments of the present invention.

Certain operations are described herein as occurring in the microcontroller 110. Such description is intended to include operations which may be performed by hardware which may be associated with the microcontroller such as peripheral hardware on a chip on which the microcontroller 110 may reside. It is also appreciated that some or all of these operations, in any embodiment, may alternatively be performed by the external interface controller 100 including operations which may be performed by hardware which may be associated with the interface controller 100 such as peripheral hardware on a chip on which the interface controller may reside. Finally it is appreciated that controllers 100 and 110 may each physically reside on a single hardware device, or alternatively on several operatively associated hardware devices.

Figure 5:
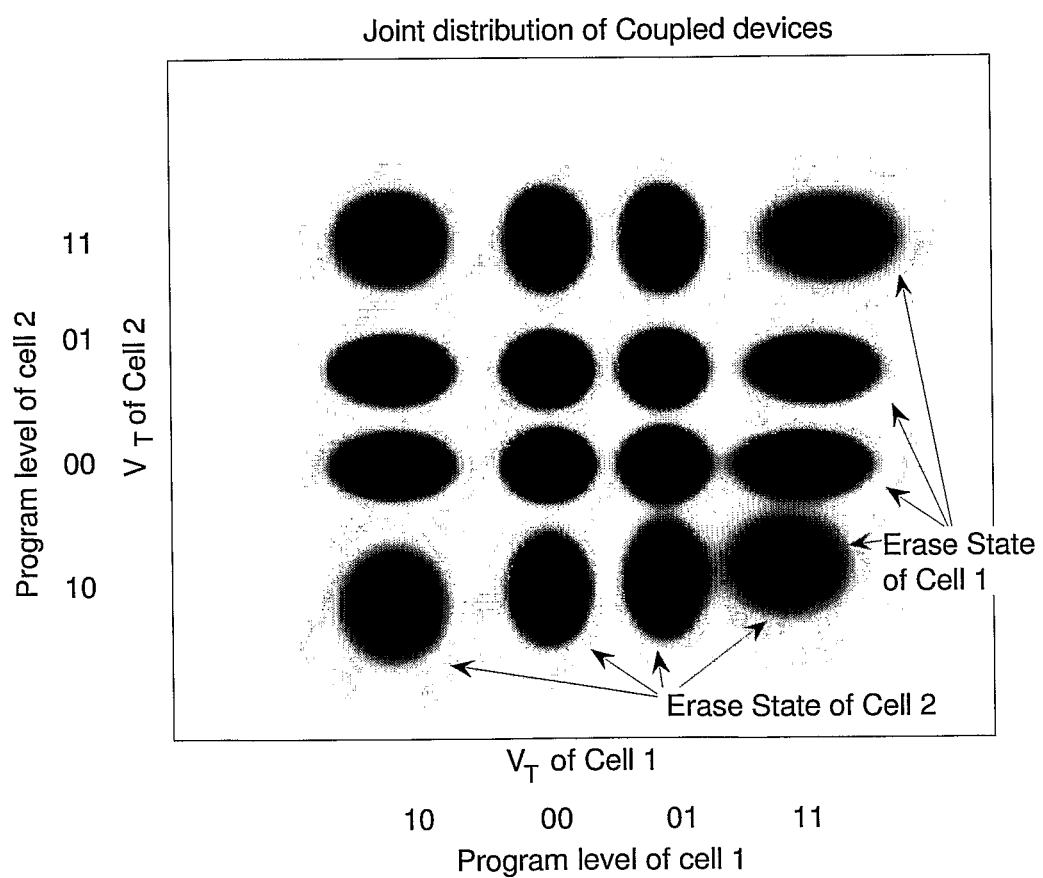
FIG. 5 is a prior art graph illustrating the joint conditional probability densities of two coupled cells, based on the examples in FIG. 1 and FIG. 3.

FIG. 5 is a prior art graph illustrating the joint conditional probability densities of two coupled cells, based on the examples in FIG. 1 and FIG. 3.

In this example, the coupling is visible in the Erase states of each one of the two cells (i.e. the Vt of one cell in the Erase state is dependant on the programmed level of the other cell).

Figure 6:
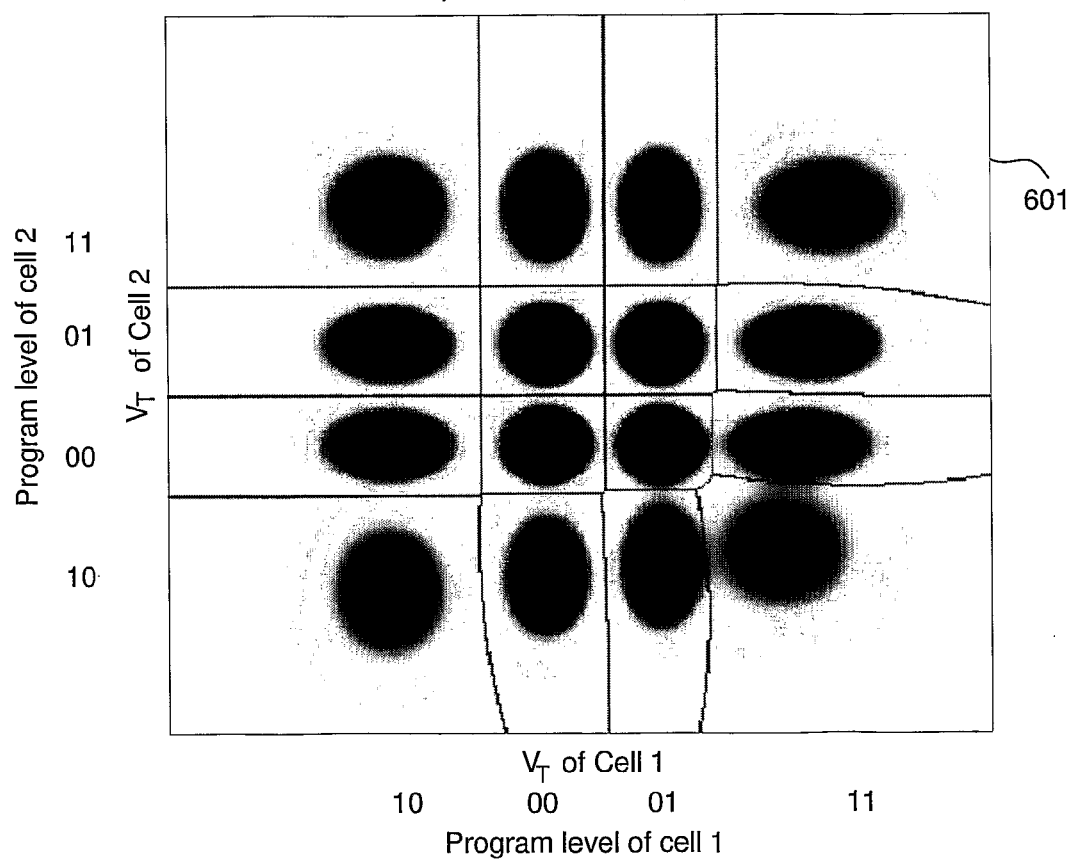
FIG. 6 is a prior art graph illustrating a division into optimal decision regions for the case presented in FIG. 5.

According to certain embodiments of the present invention, the joint detection is based on a joint maximum likelihood (ML) detection method. Accordingly, the space of multi-dimensional levels (k dimension for k cells jointly detected) is divided into optimal decision regions ($L^k$ regions, where L denotes the number of possible program levels). FIG. 6 is a prior art graph illustrating a division into optimal decision regions for the case presented in FIG. 5. For example, optimal decision region 601 corresponds to program level 11 of cell 1 and program level 11 of cell 2. According to certain embodiments of the present invention, the division into optimal decision regions is carried out according to the maximum likelihood criterion defined by:

$$\max_{\substack{i_1=1\ldots L \\ \vdots \\ i_k=1\ldots L}} f(V_{T1\ldots k} \mid \text{programmed levels} = i_{1\ldots k})$$

Where $i_{1\ldots k}$ are the programmed levels of cells 1 to k, respectively and $f(V_{T1\ldots k}|\text{programmed levels}=i_{1\ldots k})$ is the joint conditional probability density function (i.e. the probability that the charge levels of cells 1 through k are equal to $V_{T1}$ through $V_{Tk}$ given that cells 1 ... k are programmed with program levels given that levels $i_{1\ldots k}$ were programmed).

Figure 7:
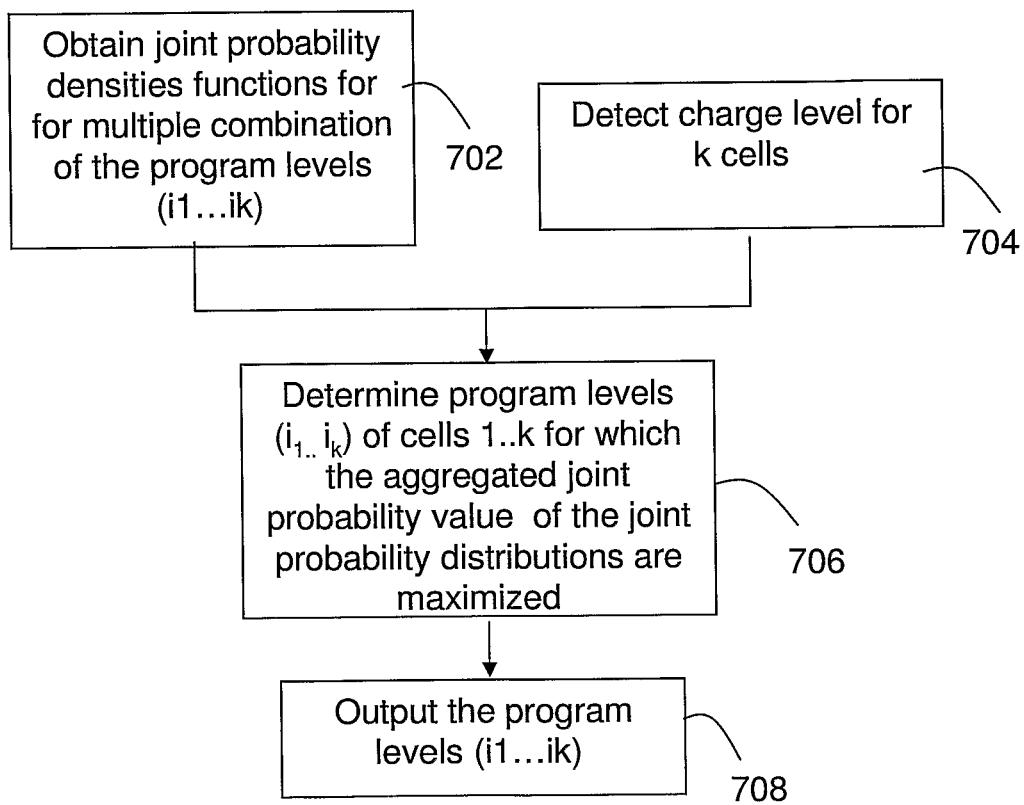
FIG. 7 is a simplified flowchart illustration of an example of a method of operation for the microcontroller 110 of FIG. 4A, including a maximum likelihood (ML) detection procedure operative according to certain embodiments of the present invention.

FIG. 7 is a simplified flowchart illustrating a first method of operation for the microcontroller of FIG. 4A, in which a maximum likelihood (ML) detection procedure is demonstrated according to certain embodiments of the present invention.

In operation 702, joint conditional probability densities for every possible combination of program levels $i_1 \ldots _k$ are obtained. In certain embodiments, in the case that all devices follow approximately the same statistical behavior, the joint conditional probability density functions (PDFs) and the coupling effect between coupled cells may be learned (approximated) in advance using a limited number of devices in a lab experiment. In other words the statistical behavior of the $V_T$ of a cell given its own and its coupled cells actual program levels, can, in certain applications, be assumed to be known in advance. Those lab experiments also take into account the effects of the number of program/erase cycles and the amount of retention (the integral of the temperature along time that passed since the device has been programmed) the device has endured. Modeling methods are known in the art, e.g. see "Flash EEPROM Threshold Instabilities due to Charge Trapping During Program/Erase Cycling", Nela Mielke, Hanmant Belgal, Ivan Kalastirsky, Parnav Kalavade, Andrew Kurtz, Qingru Meng, Nick Righos, and Jie Wu, IEEE Transactions on Device and Materials Reliability, Vol. 4, No. 3, September 2004.

In operation 704, charge level for each one of the k cells is detected. The joint conditional probability densities and the measured $V_T$'s are then used in operation 706 in order to compute the specific program levels ($i_1 \ldots _k$) for which a joint probability value of all the joint conditional probability densities (also termed aggregated joint probability value) is maximized given the measured $V_T$'s. Those detected program levels are then outputted in operation 708.

A non-limiting example of how the distribution of the $V_T$ may depend on the programmed values in the case where coupling arises only due to retention is now described. Programming the transistor to charge level L is equivalent to inserting a certain amount of charge into that cell. According to non-limiting certain embodiments, during the programming procedure a group of cells is simultaneously programmed iteratively such that any coupling effect is diminished and is hardly noticeable just following the programming. However, following retention, the cells lose charge (almost) independently and the coupling effect becomes noticeable. The charge loss is random and appears as an additive random Gaussian noise.

Assuming in a non-limiting manner that each cell is coupled only to the next one, the charge level of a cell following retention may be given as the following function: $V_{Ti}=L_i+z_i+\alpha z_{i+1}$ where $V_{Ti}$ is the charge level of cell i, $L_i$ is the programmed charge level at cell i, $\alpha$ is the coupling coefficient of the nearby cell and $z_i$ is an additive Gaussian noise at cell i (due to retention) with variance N and mean 0. Assume that decisions are taken on k cells computationally simultaneously. The noise vector is defined as:

$$\bar{z} = \begin{pmatrix} z_1 + \alpha z_2 \\ z_2 + \alpha z_3 \\ \vdots \\ z_k + \alpha z_{k+1} \end{pmatrix},$$

And defines the second moment of this vector (this is a matrix) as follows:

$$\Lambda = E[\bar{z}\bar{z}^T] = N \begin{pmatrix} 1+\alpha^2 & \alpha & & \\ \alpha & 1+\alpha^2 & \alpha & \\ & \alpha & \ddots & \ddots \\ & & \alpha & 1+\alpha^2 \end{pmatrix}$$

Thus, the density function may be:

$$f(V_{T1 \ldots k} \mid i_1, \ldots, i_k) = \exp\left(-\frac{1}{2}(V_{T1 \ldots k} - L_{1 \ldots k})^T \Lambda^{-1} (V_{T1 \ldots k} - L_{1 \ldots k})\right)$$

Where $V_{T1 \ldots k}$ is a column vector containing the charge levels of the k cells, $i_1 \ldots _k$ are the logical program values and $L_{1 \ldots k}$ is a column vector containing the programmed charge levels of these k cells ($L_{1 \ldots k}$ are a simple mapping function of the logical values $i_1 \ldots _k$).

Figure 8:
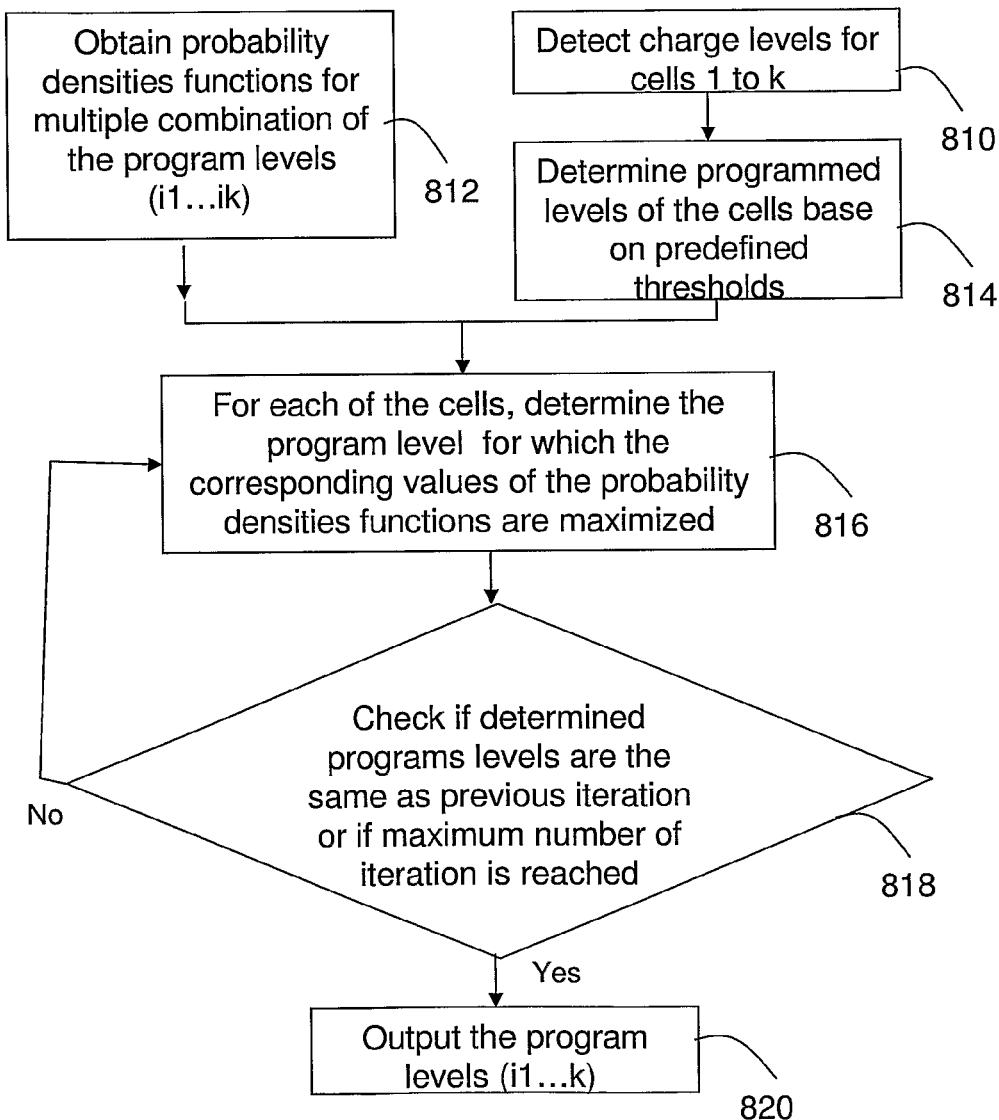
FIG. 8 is a simplified flowchart illustration of an example of a method of operation for the microcontroller 110 of FIG. 4B, including an iterative maximum likelihood (ML) detection procedure operative according to certain embodiments of the present invention.

Computing the joint maximum likelihood may lead to extensive computations if the number of cells decoded jointly is large. For example, if there are eight possible program levels and detection is performed over 8 cells computationally simultaneously, enumeration over $8^8$ possibilities is performed. In one embodiment of this invention the performance of the maximum likelihood method is approximated by using an iterative algorithm as shown in FIG. 8, which is a simplified flowchart illustrating a second method of operation for the microcontroller of FIG. 4B in which an iterative maximum likelihood (ML) detection procedure is demonstrated according to certain embodiments of the present invention. The charge levels are obtained in operation 810. In operation 814, an initial estimate of the programmed levels is made based on predefined thresholds. In operation 816, for each cell of the coupled cells the following computation is employed:

$$\max_{i_j=1 \ldots L} f(V_{Tj} \mid \text{programmed levels} = i_{1 \ldots k})$$

Where $i_j$ is the programmed levels of cells j and $f(V_{Tj} \mid \text{programmed levels}=i_{1 \ldots k})$ is the probability density function of the charge level of cell j given the programmed levels of cells 1 through k. The maximization is done over the program level of cell j while for the other cells the programmed levels that were estimated at operation 814 or operation 816 of the previous iteration are used.

Operations 816 and 818 will iterate until a certain maximum number of iteration is reached or until the chosen programmed levels no longer change.

In certain applications, a linear dependency of the coupling effect can be assumed. Due to coupling, the measured charge level in a given cell is a linear combination of the actual charge levels in that cell and those coupled to it. This linear combination may be described by a function termed linear dependency function. It is therefore reasonable to estimate the program level of a given cell using a linear combination of the measured charge levels of the given cells and the coupled cells. Without coupling, the measured charge level would have equaled $V_{Ti}=L_i+z_i$ where $L_i$ is the programmed charge level and $z_i$ is additional noise due to retention. In such a case, in order to estimate the programmed level, threshold levels based on maximum likelihood criteria of a single cell are designated (this is the one-dimensional case of the maximum-likelihood criteria mentioned above). However, due to coupling, the measured charge levels shift. A linear combination of the charge levels of the given cell and the coupled cells is therefore used to estimate the program level of that cell:

$$\hat{L}_1 = \sum_{j=1}^{k} \alpha_j V_{Tj}.$$

Note that $\hat{L}_1$ denotes an estimate of the charge level right after the programming of the cell while $L_1$ is the actual charge level right after the programming of the cell. The idea is that this estimate approximates the case where there is no coupling. A simple threshold decision is used to determine the programmed level. The coefficients $\alpha_j$ are chosen such as to minimize the standard variation of $(L_1-\hat{L}_1)$ (also termed aggregated standard variation). That is, chosen such as to minimize $E[(L_1-\hat{L}_1)^2]$ (i.e. the expected squared difference between the actual programmed voltage and the predicted programmed voltage) where the expectation is computed according to the joint conditional probability densities functions of $L_1, V_{T1}$ and $V_{T2} \ldots V_{Tk}$ (as measured on a sample of devices in a lab).

Figure 9:
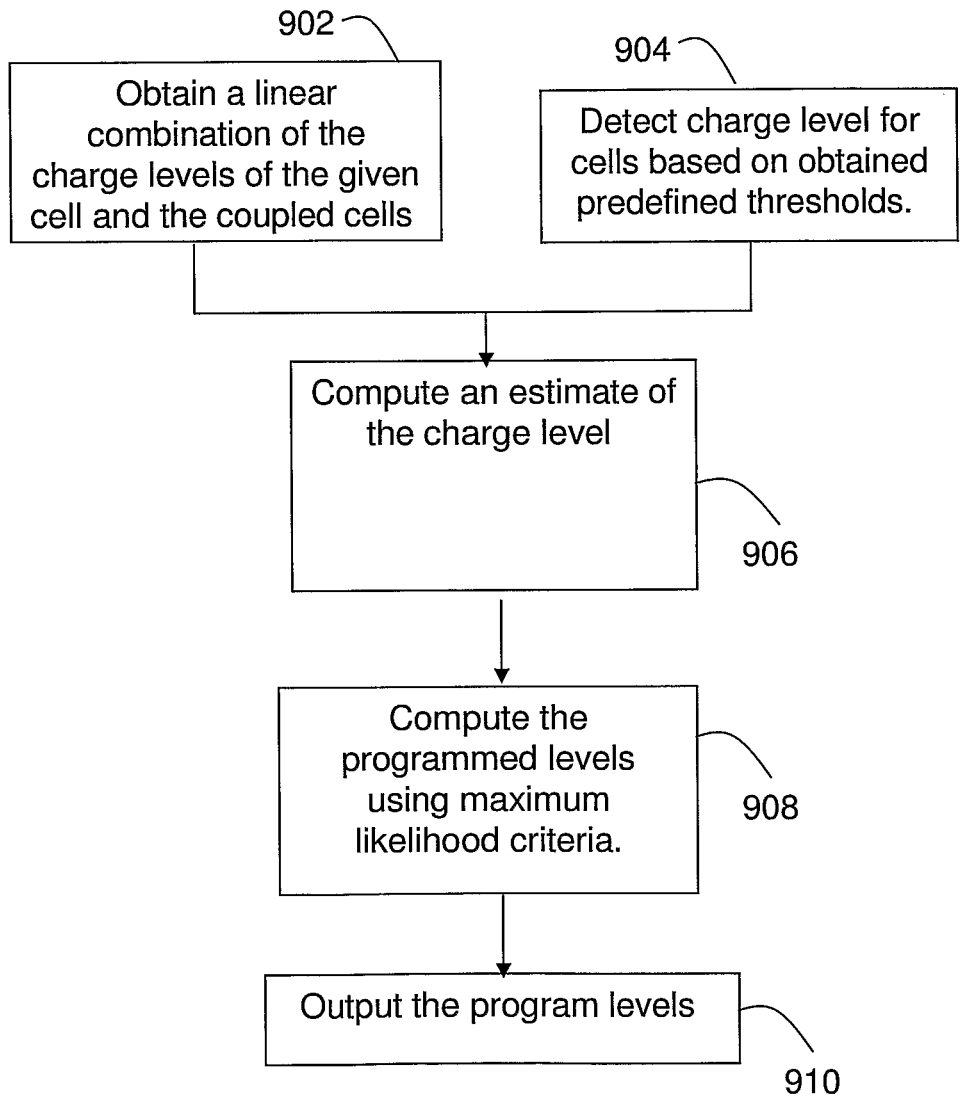
FIG. 9 is a simplified flowchart illustration of an example of a method of operation for the microcontroller 110 of FIG. 4C, including program level determination based on the cell's charge level's linear dependency on other coupled cells' charge levels, according to certain embodiments of the present invention.

FIG. 9 is simplified flowchart illustrating a third method of operation for the microcontroller of FIG. 4C in which a cell's charge level linear dependency on other coupled cells' charge levels is employed, according to certain embodiments of the present invention.

A vector of j parameters $\alpha 1 \ldots j$ is obtained such as to minimize the standard variation of $(L_1-\hat{L}_1)$ in operation 902. In operation 904 charge levels for the K cells are detected based on obtained pre-defined thresholds. $\hat{L}_1$ is then computed at operation 906 using:

$$\hat{L}_1 = \alpha_1 V_{T1} + \sum_{j=2}^{k} \alpha_j L_j$$

An estimation of the programmed level is generated based on predefined thresholds on $\hat{L}i$ in operation 908 (i.e. using the "hard decisions" $i_j$ instead of the measured charge levels). Thus, the estimation of the charge level of cell 1 right after the programming process ($\hat{L}_1$) will be a function of the measured charge level at cell 1 and the charge levels of cells 2 though k right after the programming process, according to the program levels as detected using predefined initial thresholds.

The program level is detected by using thresholds which are determined using the maximum likelihood criteria as there was no coupling (as done before). Here too, the coefficients $\alpha_j$ are chosen such as to minimize the standard variation of $(L_1-\hat{L}_1)$. A hard decision is then obtained for cell 1 which in turn may be used iteratively for all other cells. Finally, the detected program levels are outputted in operation 910.

As a non-limiting example consider the case where floating gates in a row (sharing the same control gate) are divided into even and odd gates such that the even cells are programmed first followed by the programming of the odd cells. Each even cell is coupled to the two adjacent odd cells. As the odd cells are last to be programmed, they are hardly affected by coupling. On the other hand, the even cells are affected by coupling due to the adjacent two odd cells. Therefore, the measured charge level may be approximated at a given even cell as $V_{T1}=L_1+z_1+\beta_2 V_{T2}+\beta_3 V_{T3}$ where $L_1$ is the programmed charge level and $z_1$ is the noise added due to retention and is modeled as a Gaussian random variable with zero mean (more accurate models may apply but the following is sufficient for the discussion here). $V_{T2}$ and $V_{T3}$ are the measured charge levels of the two adjacent odd cells and are modeled as $V_{T2/3}=L_{2/3}+z_{2/3}$ where again, $L_{2/3}$ is the programmed charge level and $z_{2/3}$ are independent noise elements added due to retention. Applying this model, the best choice of coefficients $\alpha_j$ (such that the above mentioned standard variation is minimized) will be $\alpha_1=\gamma$, $\alpha_2=\gamma\beta_2$, $\alpha_2=\gamma\beta_3$ for some constant $\gamma$. In the above case $\gamma=1$ would work equally fine. Furthermore, assume that the same coefficients apply for all even cells in the row. Note that according to certain embodiments of the present invention, this modeling procedure is done in a lab on a given sample set of devices, assuming that the devices behave similarly.

A fairly accurate measurement of the charge levels was used above, e.g. measuring the amount of charge and differentiating between more levels (or voltage regions) than the number of levels originally programmed. For example, if 8 levels were originally programmed we may say we have an accurate measure of the charge if we distinguish between 256 levels. However, according to some embodiments, less accurate measurement may be used. For example, in case the standard variation of the noise (due to retention or some other reason) is higher than ¹⁄₂₀th of the window, reading the charge level up to ¹⁄₆₄th of the window would usually give adequate results. FIG. 8 can be adopted to accommodate this method by replacing operation 812 with "obtain a set of coefficients $\alpha j$ (that minimize the standard variation of $(L_1-\hat{L}_1)$)" and operation 816 with "compute an estimation of the charge level of cell i right after the programming process according to:

$$\hat{L}i = \alpha_i V_{Ti} + \sum_{j=1, j \neq i}^{k} \alpha_j L_j".$$

This is known as "Decision Feedback Equalization" (see for example, MMSE decision-feedback equalizers and coding. I. Equalization results Cioffi, J. M. Dudevoir, G. P. Vedat Eyuboglu, M. Forney, G. D., Jr. Dept. of Electr. Eng., Stanford Univ., CA).

According to certain embodiments of the present invention, the joint maximum likelihood (ML) detection method is applicable when the $V_T$s are measured with sufficient accuracy, a demand that in many cases translates to extended number of read iterations, therefore compromises performance.

The extended number of read iterations may degrade the performance of the device (e.g. slower reads).

Figure 10:
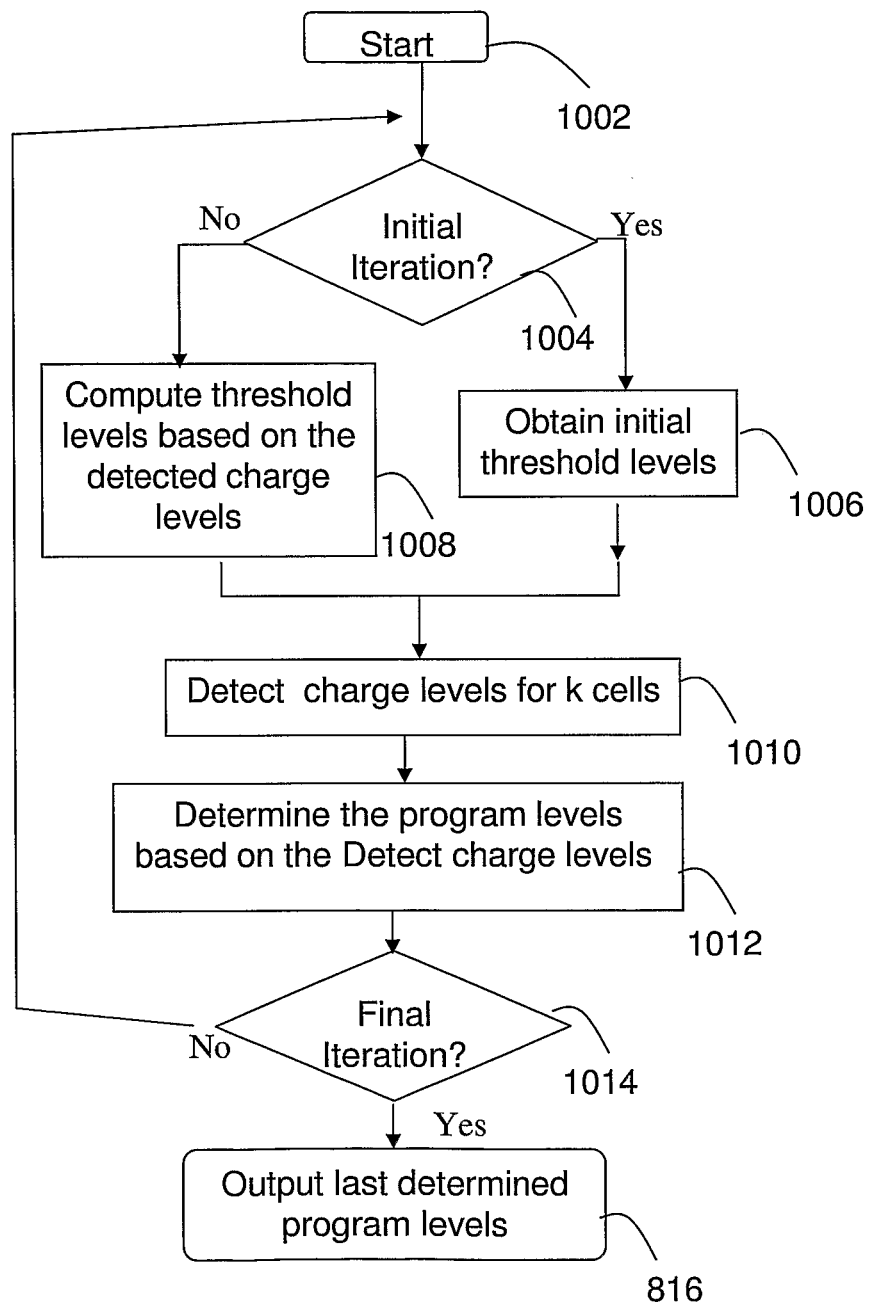
FIG. 10 is a simplified flowchart illustration of an example of a method of operation for the microcontroller 110 of FIG. 4D, including an iterative joint program level detection procedure operative according to certain embodiments of the present invention.

According to certain embodiments of the present invention, the joint program level detection method described here below enables an efficient detection under looser $V_T$s measurement accuracy demand. FIG. 10 is a simplified flowchart illustrating a fourth method of operation for the microcontroller of FIG. 4D in which an iterative joint program level detection procedure is demonstrated according to certain embodiments of the present invention. From the starting point 1002, a decision block 1004 allows recognizing the initial iteration and in this case initial threshold levels are obtained in operation 1006.

According to certain embodiments of the present invention, the predefined initial thresholds are known in advance following on an experiment based on the charge levels distributions following cycling and retention.

To compute a threshold voltage that distinguishes between program level t and t+1, a threshold voltage denoted by $V_T^{t \to t+1}$ is set such that $f_1(V_T^{t \to t+1}|i_1=t)=f_1(V_T^{t \to t+1}|i_1=t+1)$. $f_1(V_T^{t \to t+1}|i_1=t)$ is the probability density function of the charge level of cell 1 given that it was programmed to level t. In case a measurement falls above $V_T^{t-1 \to t}$ and below $V_T^{t \to t+1}$ then the cells program level is associated with level t.

The charge levels are detected (operation 1010) based on the threshold levels obtained or computed in the former operation (either in operation 1006 or operation 1008, respectively). The program levels (i1 . . . k) are computed based on the detected charge levels (operation 1012). Decision operation 1014 checks if the iterative procedure reached the last iteration (operation 1014). According to certain embodiments of the present invention, the iterative process terminates after a pre-determined number of iterations. According to certain other embodiments of the present invention, the iterative process terminates also when the threshold levels remain the same as in the previous iteration.

In the event that more iterations are carried out, each further iteration includes the computing of new threshold levels based on the measured $V_T$s levels (operation 1008). In the event that decision block 1014 concludes the procedure i.e. following the final iteration, the most recently computed program levels (i1 . . . k) are outputted.

In general, more iterations tend to yield more accurate results but take longer to perform. In many cases, setting the maximum number of iterations to two is satisfactory.

Each iteration, new thresholds are computed using one of suitable alternative methods. The actual method used for computing the new thresholds is not bounded by any particular embodiment of the present invention. The following methods for computing the new threshold levels are only several possible methods and do not limit the scope of the present invention.

Figure 11:
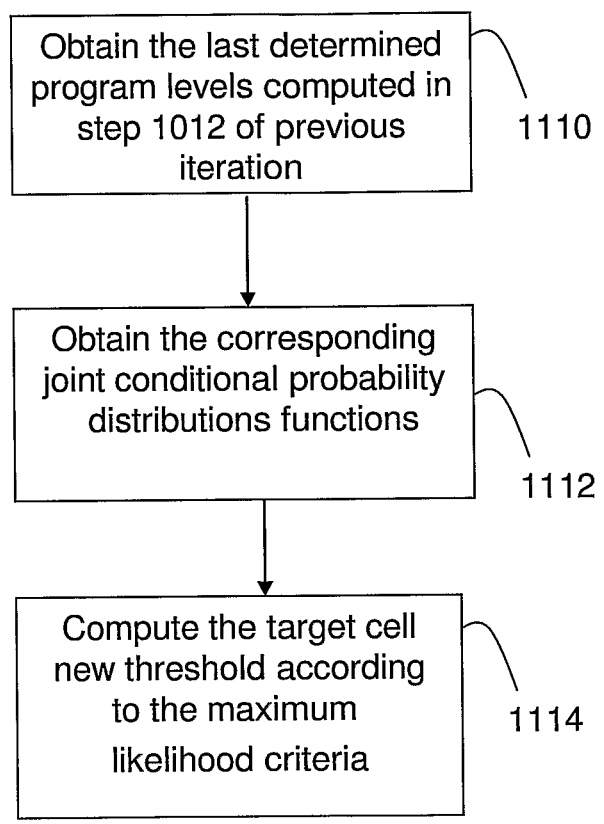
FIG. 11 is a flowchart demonstrating a method for performing operation 1008 in FIG. 10 according to certain embodiments of the present invention.

FIG. 11 is a flowchart demonstrating a method for performing operation 1008 in FIG. 10 according to certain embodiments of the present invention.

The probability density function of cell 1 is denoted by $f_1(V_T|i_1, i_2, \ldots, i_k)$ where $i_1 \ldots k$ denote the programmed levels of cells 1 through k. Assuming there are L program levels and L−1 threshold levels are set in order to distinguish between these L program levels, the new threshold levels are computed as follows:

In operation 1110, for each cell (will also be referred to as "target cell"), the program levels of the other coupled cells are obtained. In operation 1112, the corresponding joint conditional probability densities functions are obtained. In operation 1114, the target cell's new threshold according to the maximum likelihood criteria are computed as explained below:

To compute a threshold voltage that distinguished between program level t and t+1, a threshold voltage denoted by $V_T^{t \to t+1}$ is set such that $$f_1(V_T^{t \to t+1}|i_1=t, i_2, \ldots, i_k) = f_1(V_T^{t \to t+1}|i_1=t+1, i_2, \ldots, i_k)$$

In case a measurement falls above $V_T^{t-1 \to t}$ and below $V_T^{t \to t+1}$ then the cells program level is associated with level t.

As a non-limiting example of a joint conditional probability density function, assume the charge level of a cell depends only on its own programmed value and the programmed value of one additional cell (say the cell to the right of it) such that $V_{Ti}=L_i+\alpha L_{i+1}+z$ where $V_{Ti}$ is the charge level of cell i, $L_i$ is the programmed charge level at cell i, $\alpha$ is the coupling coefficient of the nearby cell and z is an additive noise due to retention. Further assume that z has a Gaussian density with variance N and zero Mean. In that case, the joint conditional probability density function is:

$$f_i(V_{Ti}|i_i, i_{i+1}) = \exp\left(-\frac{(V_{Ti} - L_i - \alpha L_{i+1})^2}{2N}\right).$$

As another example, consider the case where the coupling coefficient is a function of the programmed levels resulting in the following joint conditional probability density function:

$$f_i(V_T|i_i, i_{i+1}) = \exp\left(-\frac{(V_{Ti} - L_i - \alpha(i_i, i_{i+1})L_{i+1})^2}{2N}\right)$$

In the following non-limiting 4-level per cell example, the method illustrated in FIG. 10 is applied to reading the cell values in two operations (iterations). Reference is now made to FIG. 12A which is a table showing Gaussian parameters for distributions of Levels 10, 00 and 01, used in an example for performing the method illustrated in FIG. 10 and FIG. 12B is a Table showing Gaussian parameters for the Erase state (Level 11) distribution, used in an example for performing the method illustrated in FIG. 10.

The tables match a case similar to the example given in FIG. 1 and FIG. 3 where the coupling is visible in the erase state. Here consider the case where the cells may be divided into couples where a coupling effect is only visible within these couples. The distributions can, in certain applications, be assumed to be Gaussian with mean M and variance Σ defined by Table 1 and Table 2. In Table 2, the erase state model parameters are given as a function of the program state of the coupled device as defined by the following probability density function $$f_1(V_{T1}|i_1 = 11(\text{erase state}), i_2) = \exp\left(-\frac{(V_{T1} - M'_{i_2})^2}{2\Sigma'_{i_2}}\right)$$

where $i_2$=10, 00, 01, 11 is the programmed level of the coupled cell,

At the initial iteration, the predefined initial thresholds are obtained using the maximum likelihood criteria on the single cell distributions where the distributions used are defined by:

$$f_1(V_{T1}|i_1) = \exp\left(-\frac{(V_{T1} - M_{i_1})^2}{2\Sigma_{i_1}}\right)$$

for $i_1$=10, 00, and 01 and for the erase state which is coupled:

$$f_1(V_{T1}|i_1 = 11(\text{erase state})) = \frac{1}{4}\sum_{i_2=10,00,01,11}\exp\left(-\frac{(V_{T1} - M'_{i_2})^2}{2\Sigma'_{i_2}}\right).$$

Assume that at each iteration 3 thresholds are compared simultaneously. Therefore, using the maximum likelihood criteria for the distribution given above and the parameters given in the tables three initial thresholds are obtained: $V_T^{10 \to 00}$=3.5, $V_T^{00 \to 01}$=2.5 and $V_T^{01 \to 11}$=1.61. The charge levels are detected using those thresholds. The program levels are determined based on the detected charge levels. Program level "10" is assigned to a cell if the charge level was above 3.5, "00" if the charge level was between 3.5 and 2.5, "01" if the charge level was between 2.5 and 1.61, and "11" in case the charge level was above 1.61.

During a second iteration, the threshold levels are computed based on the outcome of the program levels detection process that took place previously. As program levels 10 00 and 01 do not suffer from coupling, the threshold levels that distinguish between these cases remain the same (i.e. 3.5 and 2.5). The only threshold which changes is that which is distinguished between level 01 and 11 (the erase state). The threshold is modified according to the programming level decided for the coupled cell, relying on the maximum likelihood criteria with respect to the distributions $$f_1(V_{T1} \mid i_1 = 11(\text{erase state}), i_2) = \exp\left(-\frac{(V_{T1} - M'_{i_2})^2}{2\Sigma'_{i_2}}\right)$$

and $$f_1(V_{T1} \mid i_1 = 01) = \exp\left(-\frac{(V_{T1} - M_{i_1})^2}{2\Sigma_{i_1}}\right)$$

(the second distribution is not dependent on $i_2$ since it does not suffer from coupling). i.e. the third threshold level is chosen such that $$\exp\left(-\frac{(V_T^{01 \to 11} - M'_{i_2})^2}{2\Sigma'_{i_2}}\right) = \exp\left(-\frac{(V_T^{01 \to 11} - M_{01})^2}{2\Sigma_{01}}\right),$$

depending on the decided program level $i_2$, in the first iteration. Thus, if in the previous iteration the coupled cell was detected as "10" then $V_T^{01 \to 11}=1.69$, for "00" $V_T^{01 \to 11}=1.61$, for "01" $V_T^{01 \to 11}=1.54$ and for "11" $V_T^{01 \to 11}=1.46$. The new program level is then determined according to the new threshold levels.

Note that in the example above, as the first two thresholds did not change, it there is no use in comparing against these thresholds in the following iterations. In the above example, iterations are made simultaneously for both coupled cells, and it is also likely that in other embodiments, these iterations are made simultaneously for several couples. That is, the comparison against thresholds is made simultaneously (at the same operation unit) for both cells and for several couples. It is therefore possible to compare against these 3 out of the 4 $V_T^{01 \to 11}$ thresholds of the second iteration simultaneously, in the second iteration. This is useful if the iterations are applied to several groups of coupled cells and the threshold may not be modified for each cell separately. That is, several cells are compared simultaneously against the same set of thresholds at any one time and we may not use different thresholds for different cells (within that time).

Figure 13:
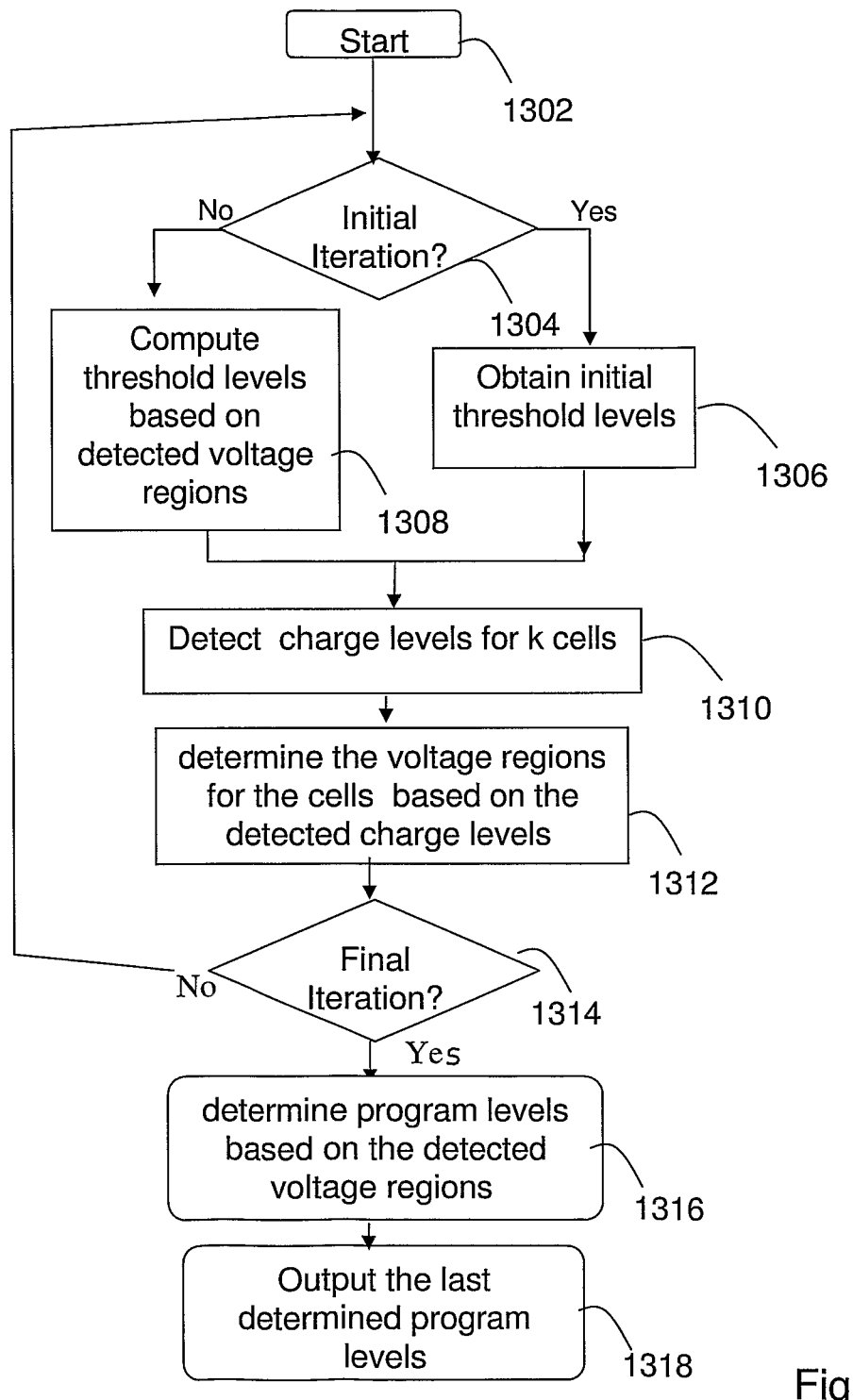
FIG. 13 is a simplified flowchart illustration of an example of a method of operation for the microcontroller 110 of FIG. 4E, including determining program level of a cell based on a voltage region iterative joint program level detection procedure operative according to certain embodiments of the present invention.

In the method of FIG. 13, explained below, the threshold computation process is refined by taking into account the voltage regions in which the charge levels of the other coupled cells have been detected. Accordingly, at each iteration, a group of cells, including the target cell and the related coupled cells, is read and a region is determined, identifying between which two threshold levels the respective cell's charge level was detected. Let $R_1 \ldots k$ denote these regions where $R_j$ is the region in which the charge level of cell j is known to lie. For example $R_1$ may represent the region between 1V to 2V.

FIG. 13 is a simplified flowchart illustrating a fifth method of operation for the microcontroller of FIG. 4E in which a voltage region based iterative joint program level detection procedure is demonstrated according to certain embodiments of the present invention.

From the starting point 1302, a decision block 1304 allows recognizing the initial iteration and in this case initial threshold levels are obtained in step 1306, in a similar manner to the way they are obtained in the method illustrated in FIG. 10.

In operation 1310, the charge levels are detected based on the threshold levels obtained or computed in the former operation (either in operation 1306 or operation 1308, respectively). In operation 1312, the voltage regions (R1 ... Rk) are computed based on the detected charge levels. In operation 1314, it is checked if the iterative procedure reached the last iteration. According to certain embodiments of the present invention, the iterative process terminates after a pre-determined number of iterations. According to certain other embodiments of the present invention, the iterative process terminates in case the difference between the threshold levels computed in the current iteration and the previous are the same. In case more iterations are carried out, in operation 1308 each further iteration includes the computing of new threshold levels based on the last detected voltage regions (R1 ... Rk). In case decision block 1314 concludes the procedure i.e. following the final iteration, in operation 1316, the most recently detected voltage regions (R1 ... Rk) are used in order to determine the program levels (i1 ... k). In operation 1318, the determined program levels are outputted.

Figure 14:
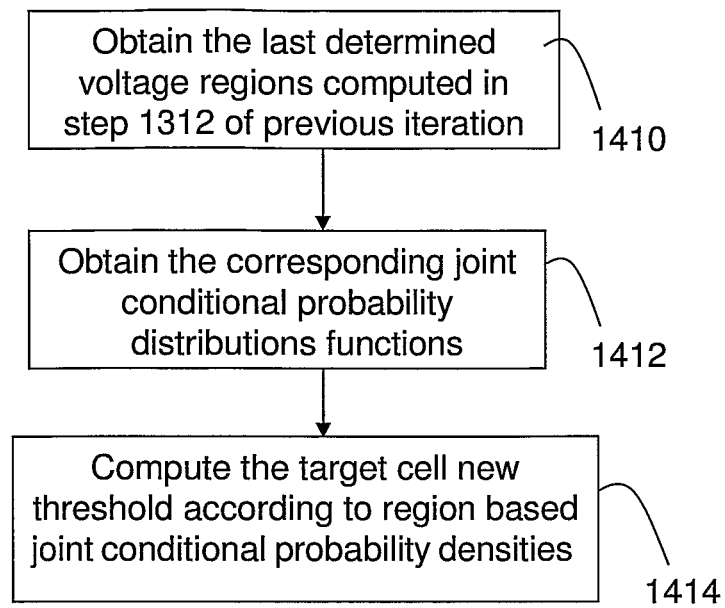
FIG. 14 is a flowchart demonstrating a method for performing operation 1308 in FIG. 13 according to certain embodiments of the present invention.

Each iteration, new thresholds are computed according to the flowchart presented in FIG. 14.

FIG. 14 is a flowchart demonstrating a method for performing operation 1308 in FIG. 13 according to certain embodiments of the present invention.

In each iteration, the regions are refined by setting new threshold levels that lie within the regions obtained at the previous read operation. The previous threshold computation method illustrated in FIG. 11 is suitable for applications in which it can be assumed that in each iteration, the true values of the program levels of the coupled cells are known and that there is no possible error. Here, the regions in which the charge levels of the other coupled cells have been detected are taken into account. Thus, it is implicitly assumed that there might have been errors in the detection of program levels in each iteration. According to certain embodiments of the present invention, in operation 1410, for each cell (will also be referred to as "target cell"), the last determined voltage regions (R1 ... Rk) are obtained. In operation 1412, the corresponding joint conditional probability densities functions are obtained. In operation 1414, the target cell's new threshold is computed according to the maximum likelihood criteria as explained below:

To compute a threshold voltage that distinguishes between program level t and t+1, a special type of joint conditional probability densities termed region based joint conditional probability densities is used and a threshold voltage denoted by $V_T^{t \to t+1}$ (i.e. the threshold voltage that distinguishes between program level t and t+1) is set such that:

$$f_1(V_T^{t \to t+1} \mid i_1=t, V_{T2} \epsilon R_2, \ldots, V_{Tk} \epsilon R_k) = f_1(V_T^{t \to t+1} \mid i_1=t+1, V_{T2} \epsilon R_2, \ldots, V_{Tk} \epsilon R_k)$$

Or, in words, a threshold voltage denoted by $V_T^{t \to t+1}$ is set such that the probability of this threshold level given that the target cell's program level is t and given that the charge levels of cells 2 ... k are within regions $R_2$ to $R_k$, respectively is equal to the probability of this threshold level given that the target cell's program level is t+1 and given that the charge levels of cells 2 ... k are in regions $R_1$ to $R_k$, respectively, where $V_{T2}, \ldots, V_{Tk}$ are the threshold levels used for the measurement of the $V_T$ of the other coupled devices.

According to certain embodiments of the present invention, a new threshold is computed for each cell according to the procedure detailed below. The new threshold is chosen such that the aggregated entropy of the posteriori program levels (i.e. the program levels that are determined in the next operation) would be minimized given the charge levels of the coupling cells, measured in the last iteration.

Following each iteration, a more refined (narrower) region, $R_1$ is obtained in which the charge level of the target cell must lie. The joint conditional probability density function of the program level $i_1$ given that region $R_1$ and the detected program levels of the other coupled cells ($i_{2\ldots k}$) is:

$$P(i_1|V_{T1} \in R_1, i_{2\ldots k}).$$

Or in words, the probability that program level i1 was programmed given that the charge level of cell 1 lies in voltage region R1 and cells 2 . . . k have program levels $i_{2\ldots k}$, respectively. The above joint conditional probability density function may be computed from the distribution of $f_1(V_T|i_{1\ldots k})$ using Bayes law (as it appears in standard text books) as follows:

$$P(i_1 \mid V_{T1} \in R_1, i_{2\ldots k}) = \frac{P(i_1) \int_{V_{T1} \in R_1} f_1(V_{T1} \mid i_{1\ldots k}) dV_{T1}}{\sum_{j=1}^{L} P(i_1 = j) \int_{V_{T1} \in R_1} f_1(V_{T1} \mid i_{1\ldots k}) dV_{T1}}$$

A set of new threshold levels which are intended to further refine the regions are denoted by $V_T^{t \to t+1}$ where $t=1,\ldots,L-1$ (i.e., assuming that L−1 thresholds are checked at each iteration. However, also consider the case where the number of thresholds is different than the number of levels programmed to a cell). Given these new threshold levels, several new possible regions are obtained, in which $V_{T1}$ may lie. These new regions are denoted by $R_1^{new}(1 \ldots L)$ (L new regions are possible with L−1 thresholds). The probability of each of these new regions may be computed as follows:

$$P(V_{T1} \in R_1^{new}(j) \mid V_{T1} \in R_1, i_{2\ldots k}) =$$
$$\sum_{i_1=1}^{L} P(V_{T1} \in R_1^{new}(j) \mid i_1, V_T^{i_1} \in R^{i_1}, i_{2\ldots k}) P(i_1 \mid V_T^{i_1} \in R^{i_1}, i_{2\ldots k})$$

The entropy of the program level $i_1$ can be computed (given the previous detected regions) as follows:

$$H(i_1 \mid V_{T1} \in R_1^{new}, i_{2\ldots k}) =$$
$$\sum_{j=1}^{L-1} H(i_1 \mid V_{T1} \in R_1^{new}(j), i_{2\ldots k}) P(V_{T1} \in R_1^{new}(j) \mid V_{T1} \in R_1, i_{2\ldots k})$$

Where $$H(i_1 \mid V_{T1} \in R_1^{new}(j), i_{2\ldots k}) =$$
$$-\sum_{i_1=1}^{L} P(i_1 \mid V_{T1} \in R_1^{new}(j), i_{2\ldots k}) \log(P(i_1 \mid V_{T1} \in R_1^{new}(j), i_{2\ldots k})).$$

Note that although it is not explicitly denoted, $H(i_1|V_{T1} \in R_1^{new}, i_{2\ldots k})$ is a function of $V_T^{t \to t+1}$ ($t=1\ldots L-1$). Therefore, the new threshold levels are computed as follows:

$$\operatorname*{argmin}_{V_T^{t \to t+1}, t=1\ldots L-1} H(i_1 \mid V_{T1} \in R_1^{new}, i_{2\ldots k})$$

According to certain other embodiments of the present invention, the new thresholds values $V_T^{t \to t+1}$ are simultaneously computed for k cells having program levels $i_1, i_2, \ldots, i_k$. In that case, the entropy $H(i_1, i_2, \ldots, i_k|V_{T1} \in R_1^{new}, \ldots, V_{Tk} \in R_k^{new})$ is minimized at each iteration.

Where the probability function:

$$P(i_1, \ldots, i_k|V_{T1} \in R_1^{new}(j), \ldots, V_{Tk} \in R_k^{new}(j))$$

is used in order to compute the above entropy function.

According to certain embodiments of the present invention, it is assumed that hard information regarding the cell status is obtained both for the target cells and the coupled cells. This "hard" information regarding the coupled cells may be used to evaluate the shift of the target cell and therefore, may be used to obtain different reliability measures for the "hard" information. This reliability measure may be used in-turn during a soft decoding procedure. Note that even though a soft decoding procedure is conducted, no cells are sampled using a higher accuracy than is really needed for hard information.

Figure 15:
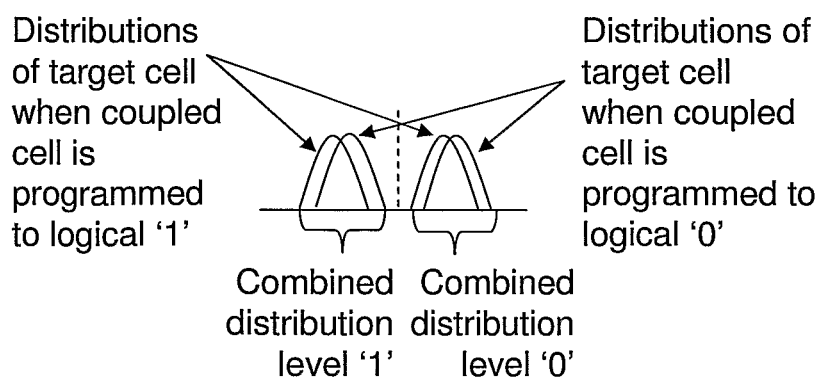
FIG. 15 is a prior art graph illustrating an example of two alternative possible pairs of charge level probability densities of a target cell.

As an example, consider a case wherein two cells as shown in FIG. 15 which are coupled to one another and each cell is stored only with one of two charge levels (i.e. one bit of information per cell). Assume that given that the coupled cell is at the erase level the distribution of the target cell is $$\frac{1}{\sqrt{2\pi\sigma^2}} e - (V_T - V_S)^2 / 2\sigma^2$$

where $V_T$ is the cell's threshold voltage, $V_S$ is either $V_0$ or $V_1$ depending on whether a '0' or a '1' was programmed to that cell and is the center of the distribution. On the other hand, if the coupled cell is programmed to a logical '0', the distributions are shifted to the right and are given by $$\frac{1}{\sqrt{2\pi\sigma^2}} e - (V_T - V_S - \delta)^2 / 2\sigma^2.$$

In case a decoupling is not performed, the combined distributions of the cases where the coupled cell is programmed to a '0' and a '1' must be taken into account. Thus, giving overall wider distribution. The threshold ($V_{TH}$) is set between the two distributions to minimize the probability of error resulting from the combined distributions. Assume that if the target cell's $V_T$ level is larger than $V_{TH}$ (i.e. $V_T > V_{TH}$) then it is declared that a '0' was programmed. On the other hand, if $V_T \le V_{TH}$, then it is declared that a '1' was programmed. In FIG. 15 the threshold is marked by the dashed line and is set in the middle between the two combined distributions $$\left(V_{TH} = \frac{V_0 + V_2 + \alpha}{2}\right).$$

Without knowledge of the coupled cell programmed level, all 'hard' results yield the exact same reliability.

However, if the programmed level of the coupled cell is known, it is possible to give specific reliability information for the target cells, depending on the hard reading and the detection of the coupled cell programmed level. One possible reliability measure is log-likelihood ratio (LLR). Let $H_T$ denote the hard decoding level of the target cell and $H_C$ the hard decoding level of the coupled cell. Then for the example represented by FIG. 15 the following four (4) reliability levels are given:

$$H_T = 0,$$

$$H_C = 0: \text{reliability}$$
$$= \log\left(\frac{P(H_T = 0 \mid X = 0, H_C = 0)}{P(H_T = 0 \mid X = 1, H_C = 0)}\right)$$
$$= \log\left(\frac{Q\left(-\frac{V_0 - {}^V TH}{\sigma}\right)}{Q\left(\frac{{}^V TH - V_1}{\sigma}\right)}\right)$$

$$H_T = 1,$$

$$H_C = 0: \text{reliability}$$
$$= \log\left(\frac{P(H_T = 1 \mid X = 1, H_C = 0)}{P(H_T = 1 \mid X = 0, H_C = 0)}\right)$$
$$= \log\left(\frac{Q\left(-\frac{{}^V TH - {}^V_1}{\sigma}\right)}{Q\left(\frac{V_0 - {}^V TH}{\sigma}\right)}\right)$$

$$H_T = 0,$$

$$H_C = 1: \text{reliability}$$
$$= \log\left(\frac{P(H_T = 0 \mid X = 0, H_C = 0)}{P(H_T = 0 \mid X = 1, H_C = 0)}\right)$$
$$= \log\left(\frac{Q\left(-\frac{V_0 + \delta - {}^V TH}{\sigma}\right)}{Q\left(\frac{{}^V TH - V_1 - \delta}{\sigma}\right)}\right)$$

$$H_T = 1,$$

$$H_C = 1: \text{reliability}$$
$$= \log\left(\frac{P(H_T = 1 \mid X = 1, H_C = 0)}{P(H_T = 1 \mid X = 0, H_C = 0)}\right)$$
$$= \log\left(\frac{Q\left(-\frac{{}^V TH - V_1 - \delta}{\sigma}\right)}{Q\left(\frac{V_0 + \delta - {}^V TH}{\sigma}\right)}\right)$$

Where $P(H_T=a|X=b, H_C=c)$ is the probability that the detected value of the target cell is a, given that the programmed value is b and the detected value of the coupled cell is c and where Q is defined by:

$$Q(t) = \int_t^\infty \frac{1}{\sqrt{2\pi}} e^{-x^2/2} dx.$$

A particular feature of certain embodiments of the present invention is that whereas in the prior art, the dependency of program levels on neighboring cells' charge levels is a one-way chain: a program level of a second cell (such as cell number 5 in row x) may depend on the charge level of a first cell (such as cell number 5 in row x−1), and a program level of a third cell (perhaps cell number 5 in row x+1) may depend on the charge level of the second cell, and so forth, however, the converse does not apply: the program level of the first cell does not depend on the charge level of the second cell, the program level of the second cell does not depend on the charge level of the third cell, and so forth. In contrast, the dependency of program levels on neighboring cells' charge levels according to these embodiments goes beyond one-way chaining: The program level of each of at least one set of various cells, and perhaps of any given set of cells, may depend on the charge levels of all other cells in the set.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix' HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Example of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly the NAND interface component.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

Features of the present invention which are described in the context of separate embodiments may also be provided in combination in a single embodiment. Conversely, features of the invention which are described for brevity in the context of a single embodiment may be provided separately or in any suitable subcombination.

The invention claimed is:

1. A method for reading cells of a flash memory, said method comprising:
comparing a charge level of a first individual cell to a first plurality of charge level boundary points, thereby to determine a first program level of said first individual cell, and subsequently comparing a second charge level of a second individual cell to a second plurality of charge level boundary points, wherein said first plurality of boundary points depends on at least one charge level of at least one neighbor of said first cell and said second plurality of boundary points depends on at least one charge level of at least one neighbor of said second cell such that said first and second pluralities of boundary points differ.

2. The method according to claim 1, further comprising:
obtaining joint conditional probability densities for a plurality of combinations of program levels of said first individual cell; and determining program levels for said first individual cell and at least one neighbor of said first cell such that an aggregated joint probability value of said joint conditional probability densities is maximized.

3. The method according to claim 1, further comprising: a) obtaining a linear dependency function which refers to at least the individual cell and at least one neighbor of said first cell; b) computing an estimated charge level for the first individual cell based on the linear dependency function; and c) determining program level for said first individual cell and at least one neighbor of said first cell such that the aggregated standard variation between the estimated charge level of the first individual cell and a detected charge level of said first individual cell is minimized.

4. The method according to claim 1, wherein said comparing further comprising: a) obtaining initial charge level boundary point values; and b) comparing a charge level of the first individual cell to said initial charge level boundary point values.

5. The method according to claim 4, further comprising:
determining program levels for said first individual cell and at least one neighbor of said first cell based on charge levels, including, for each of at least one individual cell of said first individual cell and at least one neighbor of said first cell, perform iteratively, at least once: i) computing new charge level boundary point values for the measurement of charge level of said individual cell based on the previous detected charge level of said individual cell and on previous determined program levels of said individual cell and of at least one neighbor; ii) detecting charge levels for said individual cell based on said new threshold values; and iii) determining a new program level for said individual cell based on the last detected charge levels of said individual cell.

6. A method according to claim 5 wherein said detecting comprises comparing several cells simultaneously against a group of thresholds, said group including one or more of said new threshold values.

7. The method according to claim 1, wherein said comparing further comprising: a) obtaining initial charge level boundary point values; and b) comparing a charge level of the first individual cell to said initial charge level boundary point values.

8. The method according to claim 7, further comprising: a) determining voltage regions for said first individual cell and at least one neighbor of said first cell based on charge levels, including, for each of at least one individual cell of said first individual cell and at least one neighbor of said first cell, performing the following operations iteratively, at least once: i) computing new charge level boundary point values for the measurement of charge levels of said individual cell based on the determined voltage regions of said individual cell and at least one neighbors; ii) detecting charge levels for said individual cell based on said new charge level boundary point values; and iii) determining a new voltage region for at least said individual cell based on the last determined charge level of said individual cell and the determined voltage regions of at least one other cell, and b) determining program level of at least one individual cell based on the last determined voltage regions.

9. The method for determining program levels useful for reading cells of a flash memory, said method comprising: a) detecting charge levels for said cells; b) obtaining joint conditional probability densities for a plurality of combinations of program levels of said cells; and c) determining program levels for said cells respectively such that an aggregated joint probability value of said joint conditional probability densities is maximized.

10. The method according to claim 9 wherein determining comprises: a) determining programmed levels for each cell base on predefined thresholds;
and b) iteratively, until a criterion is met: for each cell determine a program level for which the probability value of said cell's joint conditional probability density is maximized, given the program levels of the other cells.

11. The method according to claim 9 wherein the joint conditional probability density for at least one individual cell comprises a probability that said cell contains at least one particular charge level given that a particular n-tuplet of program levels were respectively programmed into a corresponding n-tuplet of cells, said n-tuplet including said at least one individual cell and at least one neighboring cell in its vicinity.

12. The method according to claim 11 wherein the joint conditional probability density for a plurality of individual cells comprises a joint probability that said plurality of cells respectively contain a plurality of particular charge levels given that a particular n-tuplet of program levels were respectively programmed into a corresponding n-tuplet of cells, said n-tuplet including said plurality of cells and at least one neighboring cell in a vicinity of at least one of said plurality of cells.

13. The method according to claim 10 wherein the criterion includes a limitation on the number of iterations.

14. A method for determining program levels useful for reading cells of a flash memory, said method comprising: a) detecting charge levels for said cells; b) obtaining a linear dependency function which refers to at least one of the cells and at least one cell coupled thereto; c) computing an estimated charge level based on the linear dependency function; and d) determining program levels for said cells respectively such that the aggregated standard variation between a corresponding estimated charge level and the detected charge level of each cell is minimized.

15. A method for determining program levels useful for reading cells of a flash memory, said method comprising: a) obtaining charge level initial threshold values; b) detecting charge levels for said cells using said initial threshold values; c) determining a program level for each of said cells based on the detected charge levels, including, for each of at least one individual of said cells, performing the following operations iteratively, at least once: i) computing new threshold values for the measurement of charge level of said individual cell based on the previous detected charge level of said individual cell and on previous determined program levels of said individual cell and of at least one cell adjacent thereto; ii) detecting charge levels for said individual cell based on said new threshold values;

and iii) determining a new program level for said individual cell based on the last detected charge levels of said individual cell.

16. The method according to claim 15, wherein said computing comprises: For each individual one of said cells: a) obtaining the last determined program levels of at least one other cell; b) obtaining the corresponding joint conditional probability densities; and c) computing new threshold values for the cell according to maximum likelihood criteria.

17. The method according to claim 15, wherein a charge level of at least one of said cells depends at least on the cell's programmed value and the programmed value of one additional cell and the corresponding joint conditional probability densities have the following form:

$$f_i(V_{Ti} \mid i_i, i_{i+1}) = \exp\left(-\frac{(V_{Ti} - L_i - \alpha L_{i+1})^2}{2N}\right).$$

18. The method according to claim 15, wherein a charge level of at least one of said cells depends on the cell's programmed value and the programmed value of one additional cell and the corresponding joint conditional probability density functions have the following form:

$$f_i(V_{Ti} \mid i_i, i_{i+1}) = \exp\left(-\frac{(V_{Ti} - L_i - \alpha(i_i, i_{i+1})L_{i+1})^2}{2N}\right)$$

19. The method according to claim 15 wherein if said computing new threshold values results in at least one threshold value that was already used in a previous iteration for said individual cell then skipping the operation of detecting charge levels for said individual cell based on the threshold value that was already used.

20. A method for determining program levels useful for reading cells of a flash memory, said method comprising: a) obtaining charge level initial threshold values; b) detecting charge levels for said cells using said initial threshold values; c) determining voltage regions for each of said cells based on the detected charge levels, d) for each of at least one individual of said cells, performing the following operations iteratively, at least once: i) computing new threshold values for the measurement of charge levels of said individual cell based on the detected voltage regions of said individual cell and at least one cell adjacent thereto; ii) detecting charge levels for said individual cell based on said new threshold values; and iii) determining a new voltage region for at least said individual cell based on the last determined charge level of said individual cell and the determined voltage regions of at least one other cell, and e) determining the program levels based on the last determined voltage regions.

21. The method according to claim 20, wherein said computing comprises: for each individual one of said cells: a) obtaining last determined voltage regions; b) obtaining the corresponding region based joint conditional probability densities; and c) computing new threshold values for the cell according to maximum likelihood criteria.

22. The method according to claim 20, wherein said computing further comprises, for each individual one of said cells, choosing the threshold values for the measurement of charge levels such that the aggregated entropy of the determined program levels of said cells is minimized given the last detected charge levels.

23. The method according to claim 20, wherein said computing further comprises, for all of said cells simultaneously, choosing the threshold values for the measurement of charge levels such that the aggregated entropy of the determined program levels of said cells is minimized given the last detected charge levels.

24. A method of reading cells of a flash memory, said method comprising: sorting each of a plurality of cells into several categories depending on whether the cells' charge levels are above or below predetermined charge level boundary points, wherein said boundary points are independent of the charge levels in said cells; and determining each cell's program level as a function of at least the category to which it and at least one neighboring cell thereof, belong.

25. A method according to claim 24, wherein said determining further comprising:

obtaining joint conditional probability densities for a plurality of combinations of program levels of said cells; and determining program levels for said cells respectively such that an aggregated joint probability value of said joint conditional probability densities is maximized.

26. A method according to claim 24, wherein said determining further comprising:

obtaining a linear dependency function which refers to at least one of the cells and at least one cell coupled thereto; computing an estimated charge level based on the linear dependency function; and determining program levels for said cells respectively such that the aggregated standard variation between a corresponding estimated charge level and detected charge level of each cell is minimized.

27. A method according to claim 24, wherein said determining further comprises:

determining a program level for each of said cells based on the detected category, including, for each of at least one individual of said cells, performing the following operations iteratively, at least once: i) computing new charge level boundary points for the measurement of charge level of said individual cell based on the previous detected charge level of said individual cell and on previous determined program levels of said individual cell and of at least one of the neighboring cells; ii) detecting charge levels for said individual cell based on said new charge level boundary points; and iii) determining a new program level for said individual cell based on the last detected charge level of said individual cell.

28. A method according to claim 24, wherein said determining further comprises:

a) determining voltage regions for each of said cells based on the detected charge levels, b) for each of at least one individual of said cells, performing the following operations iteratively, at least once: i) computing new charge level boundary points for the measurement of charge levels of said individual cell based on the detected voltage regions of said individual cell and at least one cell adjacent thereto; ii) detecting charge levels for said individual cell based on said charge level boundary points; and iii) determining a new voltage region for at least said individual cell based on the last determined charge level of said individual cell and the determined voltage regions of at least one other cell, and c) determining the program levels based on the last determined voltage regions.

29. A method for determining program levels useful for reading cells of a flash memory, said method comprising:
   a) detecting charge levels for said cells;
   b) obtaining a set of coefficients $\alpha j$ that minimize the aggregated standard variation $(L_1 - \hat{L}_1)$;
   c) iteratively, as long as a criterion is met: computing an estimation of the charge level for each of said cells according to:

$$\hat{L}i = \alpha_i V_{Ti} + \sum_{j=1, j\neq i}^{k} \alpha_j L_j;$$

wherein the criterion includes a limitation on the number of iterations.

30. A system for reading cells of a flash memory, said system comprising: a micro-controller; and an array of cells wherein said micro-controller is operatively configured to:
   compare a charge level of a first individual cell to a first plurality of charge level boundary points, thereby to determine a first program level of said first individual cell, and
   subsequently compare a second charge level of a second individual cell to a second plurality of charge level boundary points, wherein said first plurality of boundary points depends on at least one charge level of at least one neighbor of said first cell and said second plurality of boundary points depends on at least one charge level of at least one neighbor of said second cell such that said first and second pluralities of boundary points differ.

31. A system for determining program levels useful for reading cells of a flash memory, said system comprising: a micro-controller; and an array of cells wherein said micro-controller is operatively configured to: detect charge levels for said cells; obtain joint conditional probability densities for a plurality of combinations of program levels of said cells; and determine program levels for said cells respectively such that an aggregated joint probability value of said joint conditional probability densities is maximized.

32. A system for determining program levels useful for reading cells of a flash memory, said system comprising: a micro-controller; and an array of cells wherein said micro-controller is operatively configured to: a) detect charge levels for said cells; b) obtain a linear dependency function which refers to at least one of the cells and at least one cell coupled thereto; c) compute an estimated charge level based on the linear dependency function; d) determine program levels for said cells respectively such that the aggregated standard variation between a corresponding estimated charge level and the detected charge level of each cell is minimized.

33. A system for determining program levels useful for reading cells of a flash memory, said system comprising: a micro-controller; and an array of cells wherein said micro-controller is operatively configured to: a) obtain charge level initial threshold values; b) detect charge levels for said cells using said initial threshold values; c) determine a program level for each of said cells based on the detected charge levels, including, for each of at least one individual of said cells, performing the following operations iteratively, at least once: i) compute new threshold values for the measurement of charge level of said individual cell based on the previous detected charge level of said individual cell and on previous determined program levels of said individual cell and of at least one cell adjacent thereto; ii) detect charge levels for said individual cell based on said new threshold values; and iii) determine a new program level for said individual cell based on the last detected charge levels of said individual cell.

34. A system for determining program levels useful for reading cells of a flash memory, said system comprising: a micro-controller; and an array of cells wherein said micro-controller is operatively configured to: a) obtain charge level initial threshold values; b) detect charge levels for said cells using said initial threshold values; c) determine voltage regions for each of said cells based on the detected charge levels, d) for each of at least one individual of said cells, performing the following operations iteratively, at least once: i) compute new threshold values for the measurement of charge levels of said individual cell based on the detected voltage regions of said individual cell and at least one cell adjacent thereto; ii) detect charge levels for said individual cell based on said new threshold values; and iii) determine a new voltage region for at least said individual cell based on the last determined charge level of said individual cell and the determined voltage regions of at least one other cell, and e) determine the program levels based on the last determined voltage regions.

35. A system for reading cells of a flash memory, said system comprising: a micro-controller; and an array of cells wherein said micro-controller is operatively configured to: a) sort each of a plurality of cells into several categories depending on whether the cells' charge levels are above or below predetermined charge level boundary points, wherein said boundary points are independent of the charge levels in said cells; and b) determine each cell's program level as a function of at least the category to which it and at least one neighboring cell thereof, belong.

36. A program storage device readable by machine, tangibly embodying a program of instructions executable by the machine to perform a method for reading cells of a flash memory, said method comprising: comparing a charge level of a first individual cell to a first plurality of charge level boundary points, thereby to determine a first program level of said first individual cell, and subsequently comparing a second charge level of a second individual cell to a second plurality of charge level boundary points, wherein said first plurality of boundary points depends on at least one charge level of at least one neighbor of said first cell and said second plurality of boundary points depends on at least one charge level of at least one neighbor of said second cell such that said first and second pluralities of boundary points differ.

37. A program storage device readable by machine, tangibly embodying a program of instructions executable by the machine to perform a method for determining program levels useful for reading cells of a flash memory, said method comprising: a) detecting charge levels for said cells; b) obtaining joint conditional probability densities for a plurality of combinations of program levels of said cells; and c) determining program levels for said cells respectively such that an aggregated joint probability value of said joint conditional probability densities is maximized.

38. A program storage device readable by machine, tangibly embodying a program of instructions executable by the machine to perform a method for determining program levels useful for reading cells of a flash memory, said method comprising: a) detecting charge levels for said cells; b) obtaining a linear dependency function which refers to at least one of the cells and at least one cell coupled thereto; c) computing an estimated charge level based on the linear dependency function; and d) determining program levels for said cells respectively such that the aggregated standard variation between a corresponding estimated charge level and the detected charge level of each cell is minimized.

39. A program storage device readable by machine, tangibly embodying a program of instructions executable by the machine to perform a method for determining program levels useful for reading cells of a flash memory, said method comprising: a) obtaining charge level initial threshold values; b) detecting charge levels for said cells using said initial threshold values; and c) determining a program level for each of said cells based on the detected charge levels, including, for each of at least one individual of said cells, performing the following operations iteratively, at least once: i) computing new threshold values for the measurement of charge level of said individual cell based on the previous detected charge level of said individual cell and on previous determined program levels of said individual cell and of at least one cell adjacent thereto; ii) detecting charge levels for said individual cell based on said new threshold values; and iii) determining a new program level for said individual cell based on the last detected charge levels of said individual cell.

40. A program storage device readable by machine, tangibly embodying a program of instructions executable by the machine to perform a method for determining program levels useful for reading cells of a flash memory, said method comprising: a) obtaining charge level initial threshold values; b) detecting charge levels for said cells using said initial threshold values; c) determining voltage regions for each of said cells based on the detected charge levels, d) for each of at least one individual of said cells, performing the following operations iteratively, at least once: i) computing new threshold values for the measurement of charge levels of said individual cell based on the detected voltage regions of said individual cell and at least one cell adjacent thereto; ii) detecting charge levels for said individual cell based on said new threshold values; and iii) determining a new voltage region for at least said individual cell based on the last determined charge level of said individual cell and the determined voltage regions of at least one other cell, and e) determining the program levels based on the last determined voltage regions.

41. A program storage device readable by machine, tangibly embodying a program of instructions executable by the machine to perform a method of reading cells of a flash memory, said method comprising: sorting each of a plurality of cells into several categories depending on whether the cells' charge levels are above or below predetermined charge level boundary points, wherein said boundary points are independent of the charge levels in said cells; and determining each cell's program level as a function of at least the category to which it and at least one neighboring cell thereof, belong.

* * * * *